US012801006B2

(12) United States Patent
Hsu et al.

(10) Patent No.: US 12,801,006 B2
(45) Date of Patent: Nov. 17, 2026

(54) PROTECTION LAYER ON LOW THERMAL EXPANSION MATERIAL (LTEM) SUBSTRATE OF EXTREME ULTRAVIOLET (EUV) MASK

(71) Applicant: TAIWAN SEMICONDUCTOR MANUFACTURING COMPANY, LTD., Hsinchu (TW)

(72) Inventors: Pei-Cheng Hsu, Taipei (TW); Ta-Cheng Lien, Cyonglin Township (TW); Ping-Hsun Lin, New Taipei City (TW); Shih-Che Wang, Hsinchu City (TW); Hsin-Chang Lee, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 281 days.

(21) Appl. No.: 17/873,106

(22) Filed: Jul. 25, 2022

(65) Prior Publication Data

US 2022/0365414 A1 Nov. 17, 2022

Related U.S. Application Data

(62) Division of application No. 16/534,968, filed on Aug. 7, 2019, now Pat. No. 12,001,132.

(Continued)

(51) Int. Cl.

*G03F 1/22* (2012.01)
*G03F 1/48* (2012.01)

(Continued)

(52) U.S. Cl.

CPC .................. *G03F 1/22* (2013.01); *G03F 1/48* (2013.01); *G03F 1/52* (2013.01); *G03F 1/54* (2013.01); *H10P 76/2041* (2026.01)

(58) Field of Classification Search

CPC ..... G03F 1/22; G03F 1/48; G03F 1/52; G03F 1/54; G03F 1/24; G03F 1/38; G03F 1/30;

(Continued)

(56) References Cited

U.S. PATENT DOCUMENTS 8,796,666 B1 8/2014 Huang et al.
9,093,530 B2 7/2015 Huang et al.

(Continued)

FOREIGN PATENT DOCUMENTS

WO 2016/043147 A1 3/2016

OTHER PUBLICATIONS

Non-Final Office Action issued in U.S. Appl. No. 16/534,968, dated Mar. 26, 2021.

(Continued)

*Primary Examiner* — Keith D. Hendricks
*Assistant Examiner* — Richard David Champion
(74) *Attorney, Agent, or Firm* — STUDEBAKER BRACKETT PLLC

(57) ABSTRACT

Fabricating a photomask includes forming a protection layer over a substrate. A plurality of multilayers of reflecting films are formed over the protection layer. A capping layer is formed over the plurality of multilayers. An absorption layer is formed over capping layer. A first photoresist layer is formed over portions of absorption layer. Portions of the first photoresist layer and absorption layer are patterned, forming first openings in absorption layer. The first openings expose portions of the capping layer. Remaining portions of first photoresist layer are removed and a second photoresist layer is formed over portions of absorption layer. The second photoresist layer covers at least the first openings. Portions of the absorption layer and capping layer and plurality of multilayer of reflecting films not covered by the second photoresist layer are patterned, forming second openings.

(Continued)

The second openings expose portions of protection layer and second photoresist layer is removed.

20 Claims, 16 Drawing Sheets

Related U.S. Application Data

(60) Provisional application No. 62/719,414, filed on Aug. 17, 2018.

(51) Int. Cl.
*G03F 1/52* (2012.01)
*G03F 1/54* (2012.01)
*H10P 76/20* (2026.01)

(58) Field of Classification Search
CPC ..... G03F 1/76; G03F 1/70; G03F 1/44; G03F 1/68; G03F 1/50; G03F 7/2002; G03F 1/80; G03F 1/86
See application file for complete search history.

(56) References Cited

U.S. PATENT DOCUMENTS

| | | | | |
|---|---|---|---|---|
| 9,184,054 | B1 | 11/2015 | Huang et al. | |
| 9,256,123 | B2 | 2/2016 | Shih et al. | |
| 9,529,268 | B2 | 12/2016 | Chang et al. | |
| 9,548,303 | B2 | 1/2017 | Lee et al. | |
| 9,618,837 | B2 | 4/2017 | Lu et al. | |
| 9,869,928 | B2 | 1/2018 | Huang et al. | |
| 9,869,934 | B2 | 1/2018 | Huang et al. | |
| 9,869,939 | B2 | 1/2018 | Yu et al. | |
| 2009/0220869 | A1* | 9/2009 | Takai | B82Y 10/00 430/5 |
| 2012/0141923 | A1* | 6/2012 | Deweerd | G03F 1/48 430/5 |
| 2013/0029253 | A1 | 1/2013 | Mangat et al. | |
| 2013/0337370 | A1* | 12/2013 | Lee | G03F 1/38 430/5 |
| 2014/0017601 | A1* | 1/2014 | Mikami | G03F 1/24 430/5 |
| 2014/0051015 | A1* | 2/2014 | Gallagher | G03F 1/38 430/5 |
| 2014/0272686 | A1* | 9/2014 | Lu | G03F 1/22 430/5 |
| 2015/0010854 | A1* | 1/2015 | Seo | G03F 1/48 430/5 |
| 2015/0037544 | A1* | 2/2015 | Lee | G03F 1/52 430/5 |
| 2017/0263444 | A1 | 9/2017 | Shoki et al. | |
| 2019/0101817 | A1 | 4/2019 | Lin | |

OTHER PUBLICATIONS

Final Office Action issued in U.S. Appl. No. 16/534,968, dated Oct. 13, 2021.
Non-Final Office Action issued in U.S. Appl. No. 16/534,968, dated Jun. 20, 2022.

* cited by examiner

PROTECTION LAYER ON LOW THERMAL EXPANSION MATERIAL (LTEM) SUBSTRATE OF EXTREME ULTRAVIOLET (EUV) MASK

CROSS REFERENCE TO RELATED APPLICATION

This application is a divisional application of and claims priority to U.S. non-provisional application Ser. No. 16/534,968, filed Aug. 7, 2019, which claims priority to U.S. provisional application Ser. No. 62/719,414 filed on Aug. 17, 2018, the entire contents of which are incorporated herein by reference.

BACKGROUND

Extreme ultraviolet (EUV) lithography is the most promising technology for semiconductor device manufacturing of the 10 nm node and beyond. In contrast to conventional lithographical techniques, EUV lithography utilizes extreme ultraviolet light to transfer a circuit layout pattern from a reflective EUV photomask (also referred to as an “EUV mask” or a “reticle”) to a semiconductor die. For an EUV photomask, multiple mask parameters should be optimized to achieve precise and high resolution pattern forming in EUV lithography. Such parameters include, but are not limited to, absorber height, optimum optical proximity effect corrections (OPC) for shadowing correction, an increase of reflectivity in image fields, and optimum image borders.

The EUV photomask may require a process flow (e.g., etching) in the black border region to remove the absorption layer/Ru/40 pair multi-layer to limit neighbor-die issues during wafer printing. The LTEM may be damaged during the process flow. The exposed LTEM may be irradiated during EUV wafer printing, and particles may be introduced during the irradiating process. These particles may migrate to a pattern region of the photomask and cause image error.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
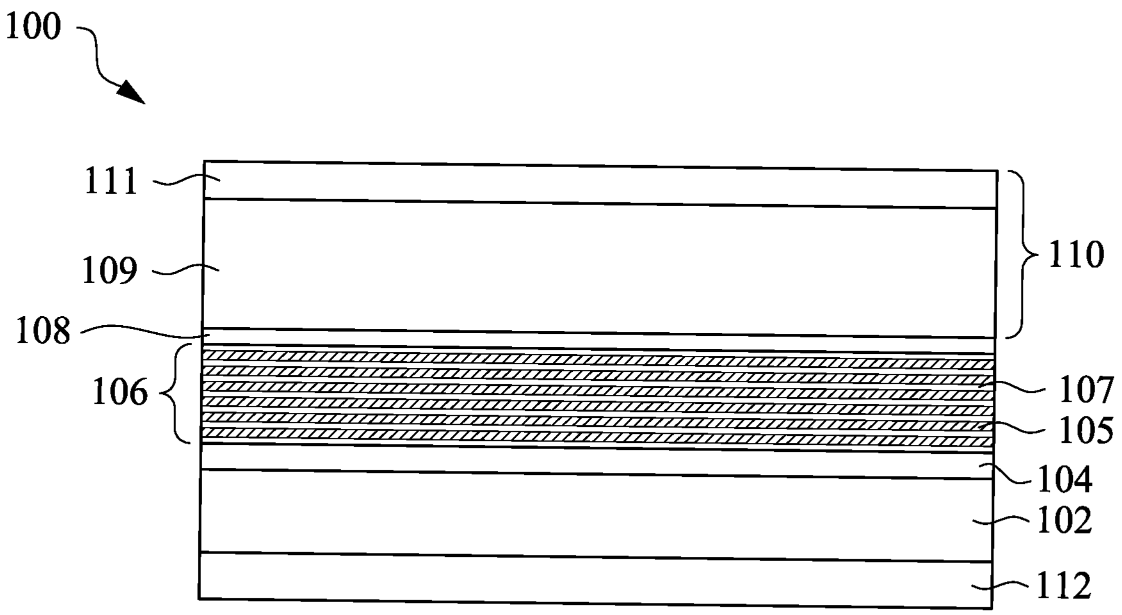
FIG. 1 illustrates an EUV photomask including a protection layer deposited on a LTEM substrate according to exemplary embodiments.

The following disclosure provides many different embodiments, or examples, for implementing different features of the disclosed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term “made of” may mean either “comprising” or “consisting of.” In the present disclosure, a phrase “one of A, B and C” means “A, B and/or C” (A, B, C, A and B, A and C, B and C, or A, B and C), and does not mean one element from A, one element from B and one element from C, unless otherwise described.

While methods disclosed herein are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Terms like “simulate,” “optimize,” “adjust,” “creating,” “manufacture,” “fabricate,” “make,” “form,” “compare,” “generate,” “choose,” “determine,” “calculate,” “measure,” are used to describe operations of the disclosed methods, apparatus, or system. These terms include the operations that are performed, for example, by one or more computers connected to or disconnected from a network and having a user interface to receive the user/designer's inputs and/or commands and a data communication interface or a network interface so as to exchange data with semiconductor manufacturing tools including, but not limited to, a lithography tool and an e-beam writer, and semiconductor testing (or characterization, measurement, or metrology) tools including, but not limited to, a scanning electron microscope. The operations that correspond to these terms can vary depending on the particular implementation and are readily discernible by one of ordinary skill in the art.

Extreme ultraviolet (EUV) photomasks have a black border area, over which mask blades of an EUV lithography tool are placed. The black border is a pattern free dark area around the die on the photomask serving as transition area between parts of the mask that are shielded from the exposure light by the reticle masking (REMA) blades and the die. When printing a die at a dense spacing on an EUV scanner, the EUV light reflection from the image border overlaps edges of neighboring dies. This reflected light also contains various wavelengths that are not required, known as out-of-band (OOB) light. The OOB light adversely affects the accuracy of patterns to be formed on a substrate, in particular sections around the periphery of the pattern on the substrates. Additionally, leakage of EUV radiation occurs during exposure of adjacent dies because of residual absorber reflectivity and REMA blade instability, resulting in over exposure around die edges. To reduce this effect, a black border area is placed between adjacent dies. The black border area can solve CD non-uniformity caused by neighboring die exposure.

The EUV photomask may require a process flow (e.g., etching) in the black border region to remove the absorption layer/Ru/40 pair multi-layer to limit neighbor-die issues during wafer printing. The LTEM may be damaged during the process flow. The exposed LTEM may be irradiated during EUV wafer printing, and particles may be introduced during the irradiating process. These particles may migrate to a pattern region of the photomask and cause image error.

Embodiments disclosed herein use a protection layer on the low thermal expansion material (LTEM) substrate of the EUV mask blank. The protection layer can function as a stop layer when performing a process flow (e.g., etching) in the black border region and can also limit the particle generation from LTEM substrate at black border region during EUV irradiation. In another embodiment, the reflective multiple layers (ML) are not entirely etched during the black border irradiation process, but some (1-2 pairs) of the ML are retained to limit the particle generation from LTEM substrate at black border region during EUV irradiation. In yet another embodiment, a protection layer is deposited in the black border region. A black border is a frame shape area created by removing all the multilayers on the EUV photo mask in the region around a circuit pattern area. It is created to prevent exposure of adjacent fields when printing an EUV photo mask on a wafer. The width of the black border is in a range from about 1 mm to about 5 mm in some embodiments.

FIG. 1 illustrates a EUV photomask 100 including a protection layer 104 deposited on a LTEM substrate 102, according to some embodiments. In various embodiments, the LTEM substrate includes fused quartz, $TiO_2$ doped $SiO_2$, or other suitable materials with low thermal expansion. In some embodiments, the protection layer 104 includes a layer of ruthenium (Ru) or materials including Ru, such as RuN, RuB, etc. In other embodiments, the protection layer 104 includes a layer of tantalum including materials, such as TaBO, TaN, TaON, etc. In an embodiment, the thickness of the protection layer 104 including a layer of tantalum including materials is about 2 nm to about 14 nm. In some other embodiment, the protection layer 104 includes a layer of chromium including materials, such as CrON, CrN, etc. In an embodiment, the thickness of the protection layer 104 including a layer of chromium including materials is about 5.5 nm to about 9 nm, or about 14 nm to about 16 nm. Such a thickness provides low reflectivity. In yet other embodiments, the protection layer 104 includes a layer of silicon including materials such as $Si_3N_4$, SiC, SiN, etc. In an embodiment, the thickness of the protection layer 104 including a layer of silicon including materials is about 1 nm to about 50 nm. Other embodiments include the protection layer 104 including a layer of titanium including materials such as TiN, $TiO_2$. In an embodiment, the thickness of the protection layer 104 including a layer of titanium including materials is about 1 nm to about 50 nm. In further embodiments, the protection layer 104 includes a layer of $Al_2O_3$ and $B_4C$. In an embodiment, the thickness of the protection layer 104 including a layer of $Al_2O_3$ and $B_4C$ is about 1 nm to about 50 nm. In some embodiments, the protection layer 104 includes a combination of the different materials mentioned above. In some embodiments, a thickness of the protection layer 104 is about 1 nm to about 30 nm. The protective layer 104 functions as an etch stop layer and protects the LTEM during etching and EUV irradiation. Reflective multiple layers (ML) 106 are deposited on the protection layer 104. The ML 106 includes a plurality of film pairs, such as molybdenum-silicon (Mo/Si) film pairs (e.g., a layer of molybdenum 105 above or below a layer of silicon 107 in each film pair). Alternatively, the ML 106 may include molybdenum-beryllium (Mo/Be) film pairs, or other suitable materials that highly reflect EUV light. Further, a capping layer 108, such as ruthenium (Ru), ruthenium nitride (RuN), ruthenium Oxide (RuO), RuNb rich with Nb, is disposed on the ML 106 for protection. Additionally, an absorption layer 110 including a first layer 109 and a second layer 111 on the first layer 109 is deposited on the capping layer 108. In some embodiments, the first layer 109 includes TaBO and the second layer 111 includes TaBN. In other embodiments, the first layer 109 include TaBO and the second layer 111 includes CrN, or the first layer 109 includes TaBO and the second layer 111 includes CrO. In an embodiment, the absorption layer 110 includes a layer of TaBN deposited on the capping layer 108 and a layer of TaBO deposited on the layer of TaBN. As illustrated in FIG. 1, the LTEM substrate 102 is deposited over a blind layer 112. In an embodiment, the blind layer is a CrN layer. In other embodiments, the blind layer includes TaB, TaBN, or CrO.

FIGS. 2A-2F illustrate a sequence of processing steps for manufacturing the photomask 100, according to embodiments of the disclosure. It is understood that additional operations can be provided before, during, and after processes shown by FIGS. 2A-2F, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

Figure 2A:
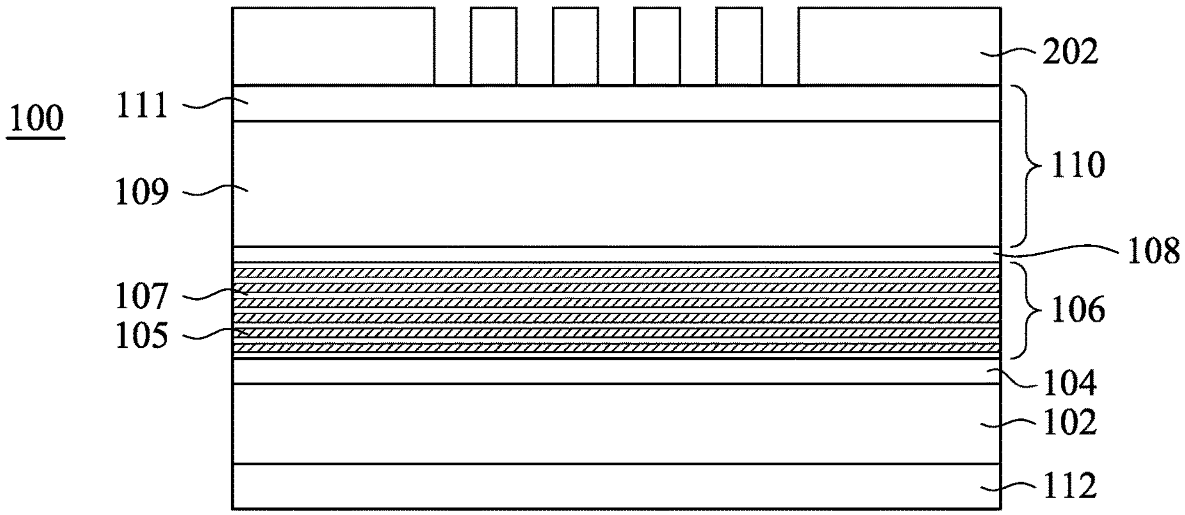
FIGS. 2A, 2B, 2C, 2D, 2E, 2F, and 2G show cross sectional views of the different processing steps for manufacturing a photomask according to some embodiments of the present disclosure.
Figure 2B:
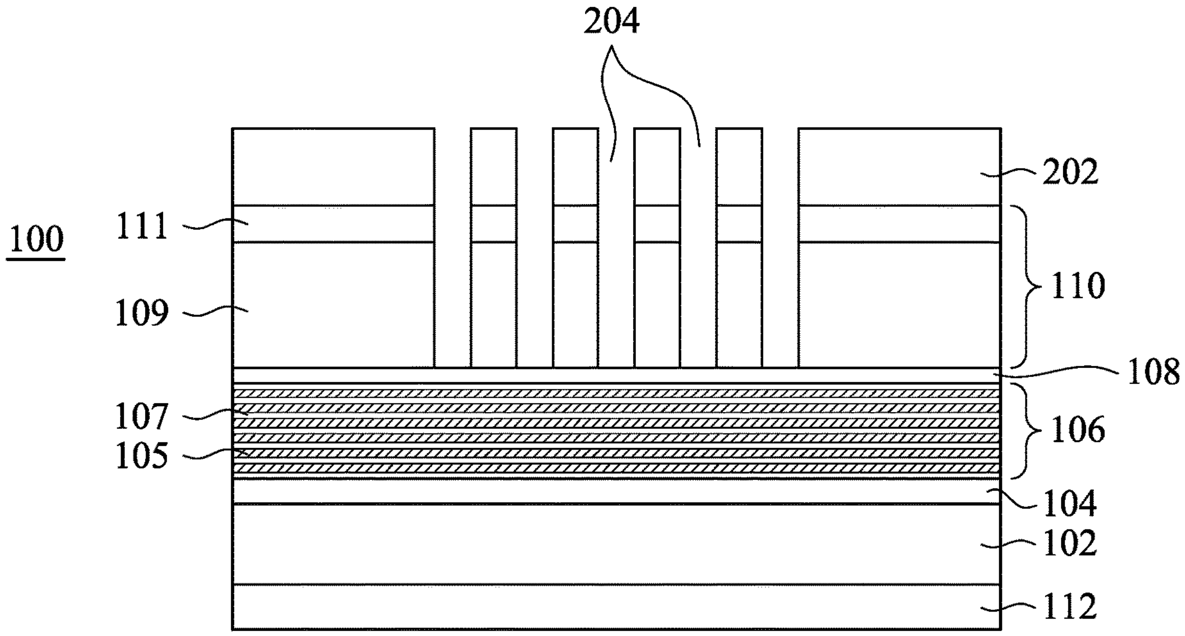
Figure 2C:
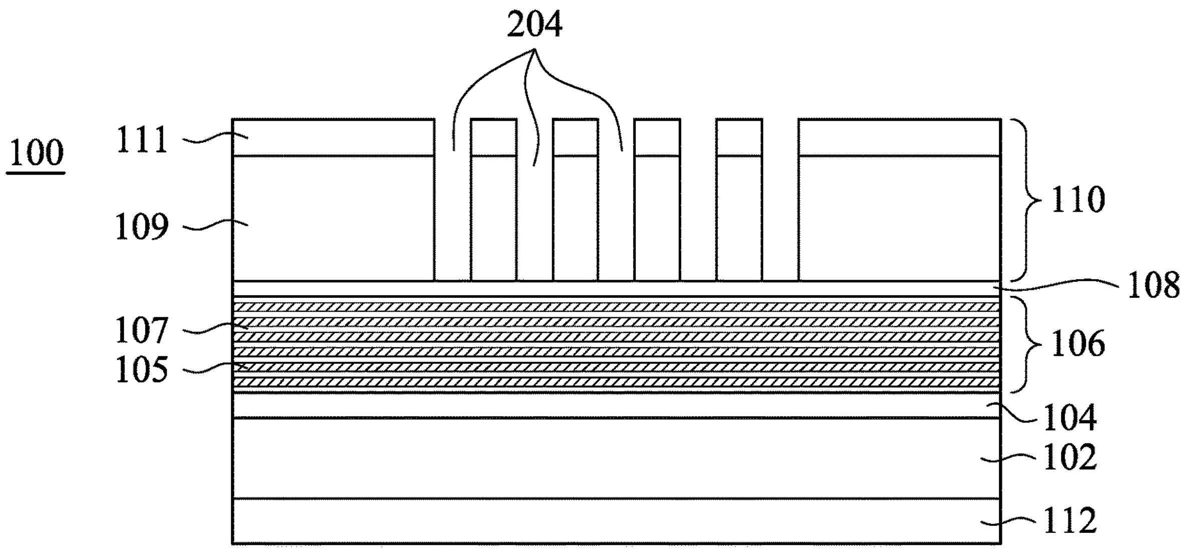
Figure 2D:
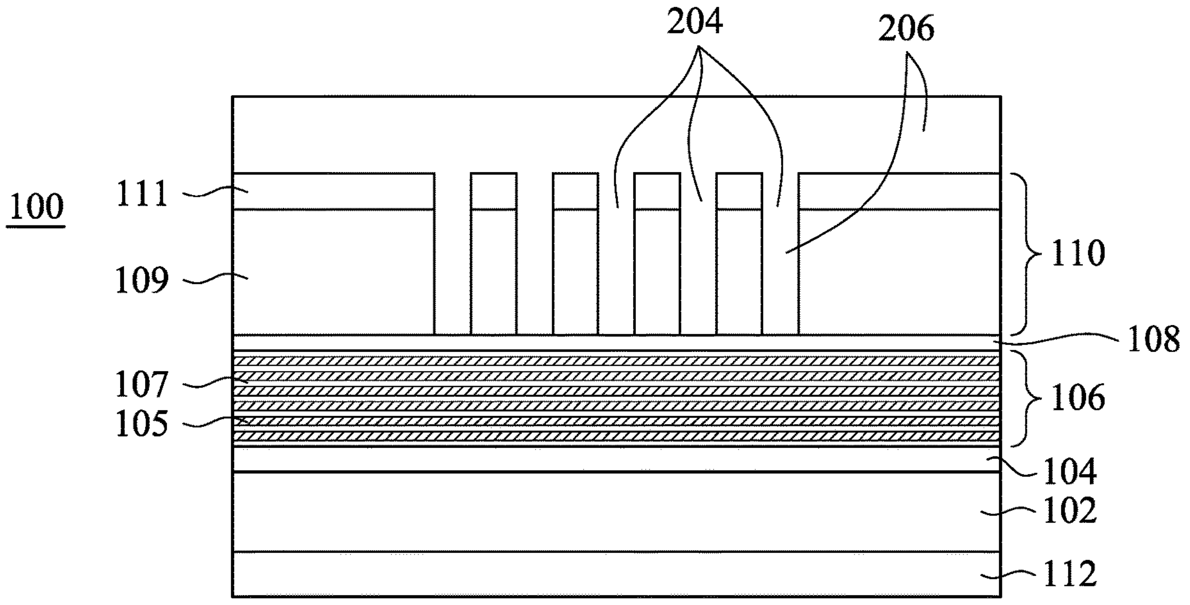
Figure 2E:
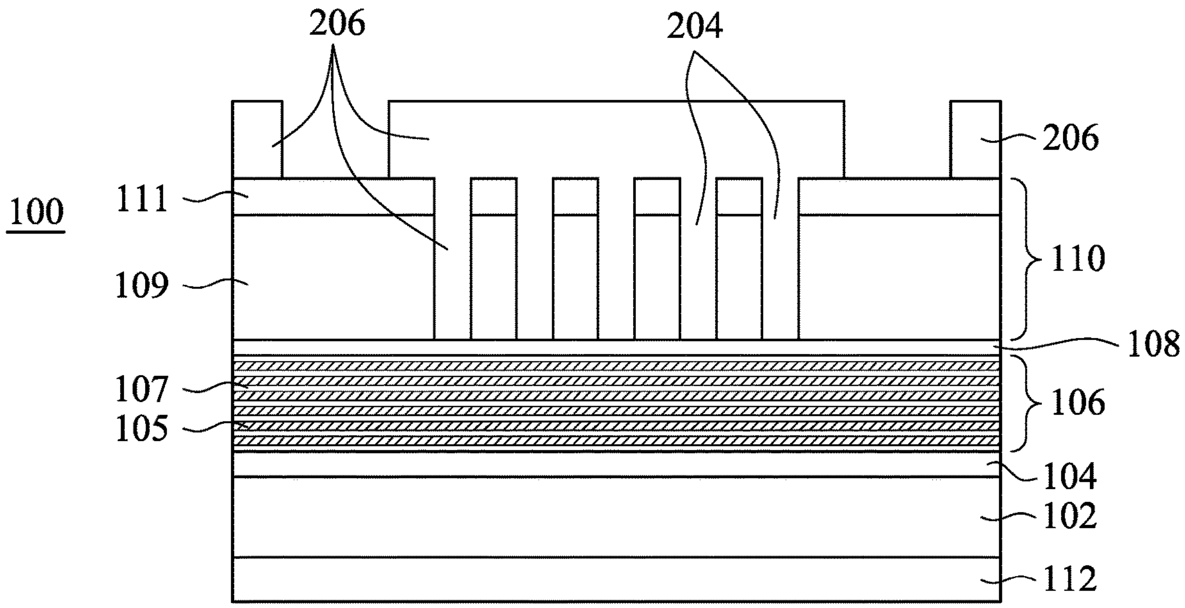

In FIG. 2A, a photoresist layer 202 is deposited on the absorption layer 110 and patterned using desired patterning techniques including, for example, electron-beam lithography, photolithography, or any other suitable process. As illustrated in FIG. 2B, an etching operation is performed to remove portions of the absorption layer 110 such as including the bilayer of TaBO and TaBN exposed by the patterned photoresist layer 202, and thereby forming first openings 204 in the absorption layer 110 that expose portions of the capping layer 108. The remaining photoresist layer 202 is removed using a suitable stripping or plasma ashing operation, as in FIG. 2C. In other embodiments, a suitable solvent is used to remove the photoresist layer 202. In some other embodiments, the photoresist layer 202 is removed by an oxygen plasma ashing operation. As illustrated in FIG. 2D, another photoresist layer 206 is deposited on the absorption layer 110 filling the first openings 204. The photoresist layer 206 is patterned to expose portions of the absorption layer 110 remaining after the previous etching operation, as illustrated in FIG. 2E.

In some embodiments, the lithography operations of the first photoresist layer and second photoresist layer include coating a photosensitive resist film over a substrate, exposing the resist film deposited over the substrate by an optical lithography tool or an electron beam writer, and developing the exposed resist film to form a resist pattern for an ion trim process or an etching process. In the present disclosure, a resist is also referred to as a photoresist. A resist may include a positive tone resist or a negative tone resist. A resist film may include a single layer resist film or a multiple layer resist films.

In some embodiments, the coating the resist film over the substrate includes performing a dehydration operation before applying the resist film over the substrate. The dehydration operation enhances the adhesion of the resist film to the substrate in some embodiments. The dehydration operation may include baking the substrate at a high temperature for a duration of time, or applying a chemical such as hexamethyldisilizane (HMDS) to the substrate. Other embodiments also include a soft bake (SB) process to drive solvent out of the resist film and increase the mechanical strength of the resist film. An antireflective coating, such as a bottom antireflective coating (BARC) or a top antireflective coating (TARC) is applied below or above the resist layers in some embodiments.

Exposing the resist film deposited over the substrate includes using an optical exposing tool, such as an ArF or KrF laser, or a charged particle exposing tool, such as an electron beam (e-beam). The optical exposing tool includes using a mask in some embodiments. The mask may be a binary mask (BIM), a super binary mask (SBIM), or a phase shift mask (PSM), which includes an alternative phase shift mask (alt. PSM) or an attenuated phase shift mask (att. PSM). Developing the exposed resist film includes a post exposure bake (PEB), a post development bake (PDB) process, or a combination thereof in some embodiments.

Figure 2F:
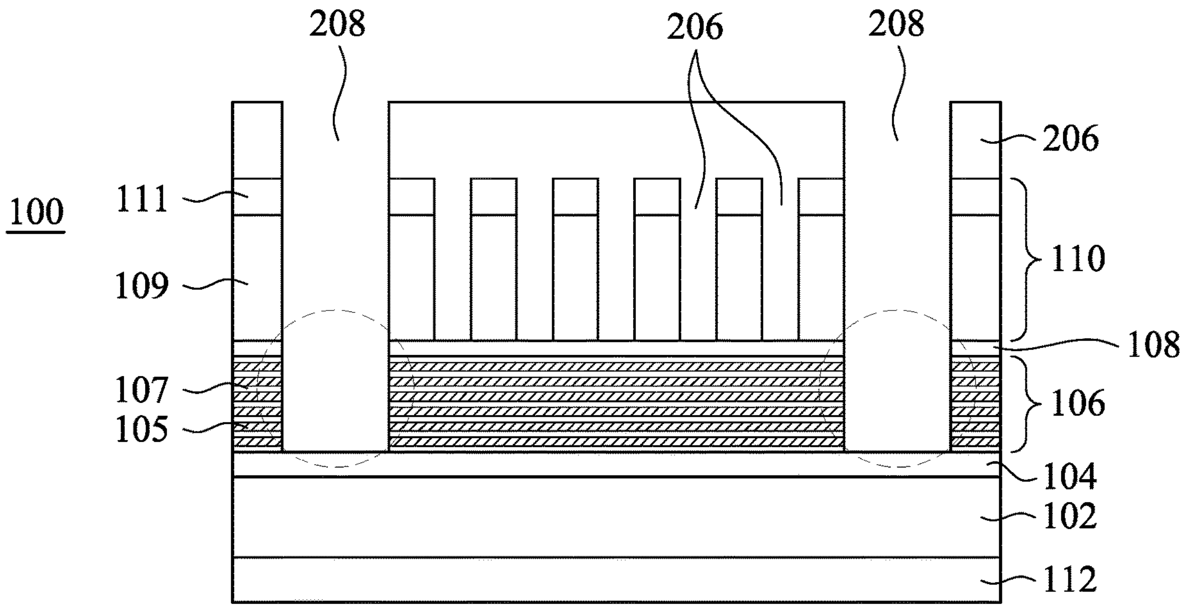

As illustrated in FIG. 2F, another etching operation is performed to remove portions of the absorption layer 110 exposed by the photoresist layer 206. In addition, the etching operation also removes portions of the capping layer 108 and the plurality of multilayer of reflecting films 106 not covered by the photoresist layer 206.

In some embodiments, the etching operations are performed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In other embodiments, the etching operation is performed using a wet etchant such as, but not limited to, $HF:HNO_3$ solution, $HF:CH_3COOH:HNO_3$, or $H_2SO_4$ solution and $HF:H_2O_2:CH_3COOH$. In some embodiments, a dry etching operation is used. The dry etching operation may use an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments, a combination of dry etching techniques and wet etching techniques are used to perform the etching operations.

Figure 2G:
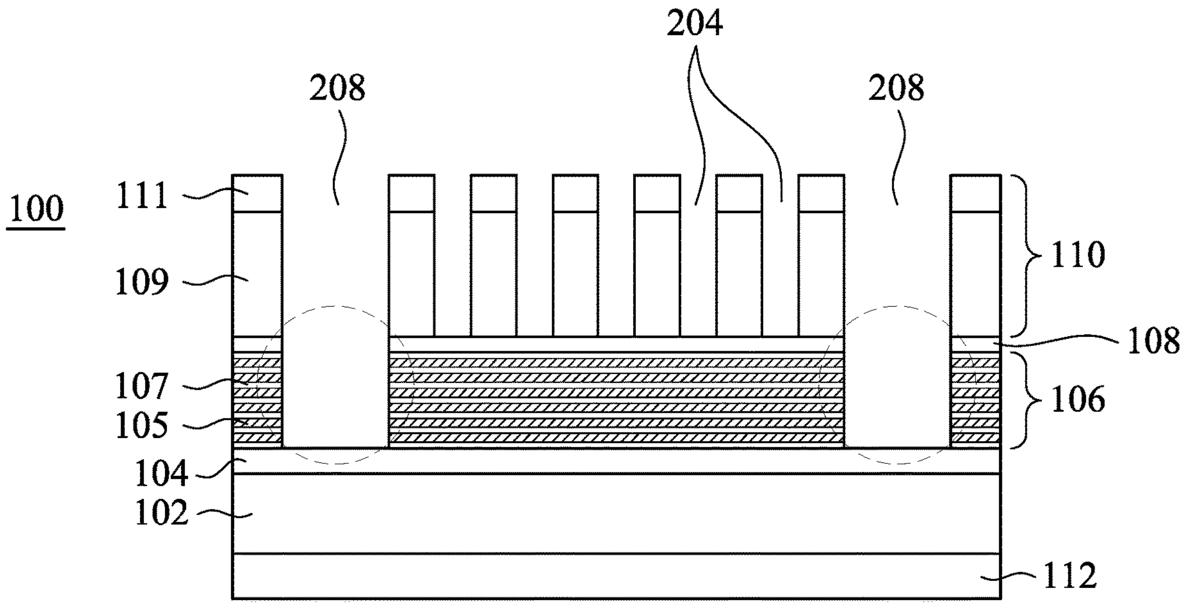

As a result, second openings 208 are formed and portions of the protection layer 104 are exposed through the second openings 208. As illustrated in FIG. 2G, the photoresist layer 206 is subsequently removed using a suitable stripping or plasma ashing operation. In other embodiments, a suitable solvent is used to remove the photoresist layer 206. In some other embodiments, the photoresist layer 206 is removed by an oxygen plasma ashing operation.

Fabrication of the photomask includes various film deposition operations. In the present embodiments, the film deposition operations include a physical vapor deposition (PVD) process, such as evaporation and DC magnetron sputtering; a plating process, such as electrode-less plating or electroplating; a chemical vapor deposition (CVD) process, such as atmospheric pressure CVD (APCVD), a low pressure CVD (LPCVD), a plasma enhanced CVD (PECVD), or a high density plasma CVD (HDP CVD); an ion beam deposition; spin-on coating; a metal-organic decomposition (MOD); an atomic layer deposition (ALD) process; and/or other suitable methods.

Figure 3:
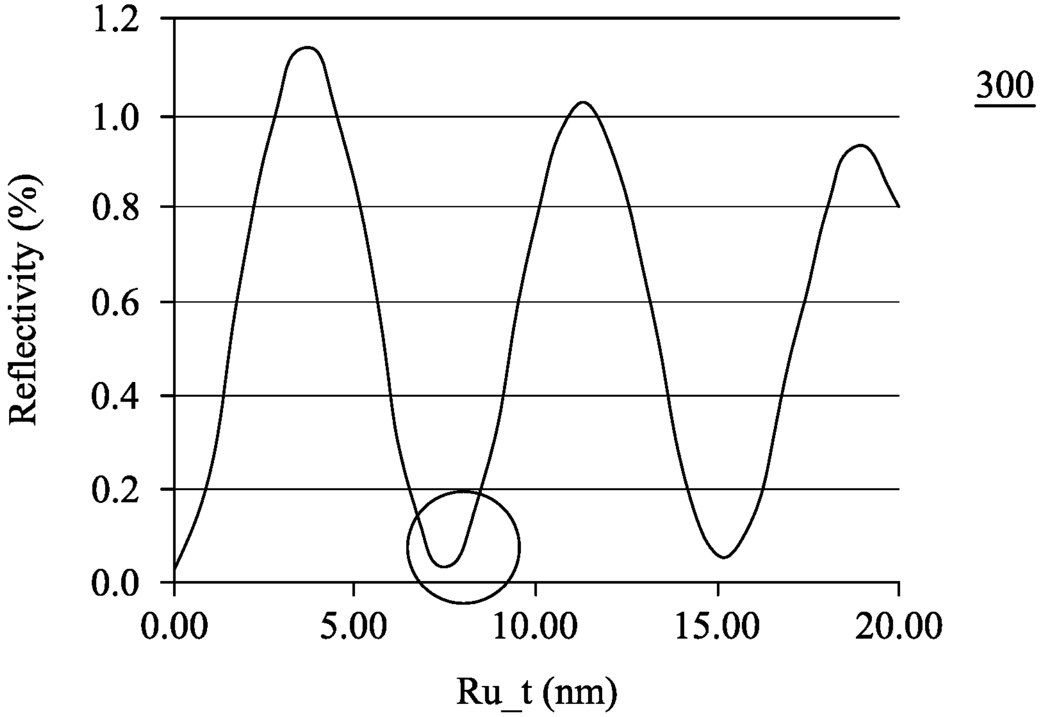
FIG. 3 is a graph illustrating a variation in the reflectivity due to the black border (BB) in the presence of the protection layer including Ru according to some embodiments of the present disclosure.

FIG. 3 is a graph 300 illustrating a variation in the reflectivity due to a black border (BB) in the presence of the protection layer 104 including Ru on the LTEM substrate 102, according to embodiments of the disclosure. As illustrated, the reflectivity is less than about 0.2% when the thickness of the protection layer including Ru is about 6.5 nm to about 8.5 nm, and when the thickness of the protection layer including Ru is about 14.5 nm to about 16.5 nm. Thus, the thickness of the protection layer including Ru can be varied as required to achieve the low reflectivity.

Figure 4:
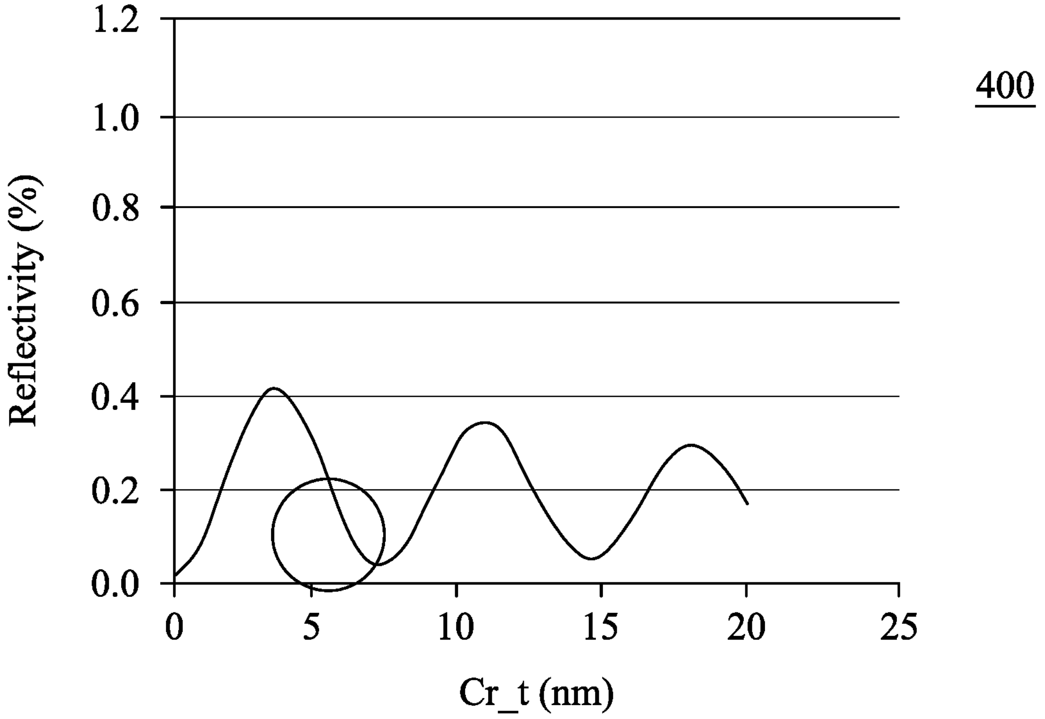
FIG. 4 is a graph illustrating a variation in the reflectivity due to the black border (BB) in the presence of the protection layer including Cr according to some embodiments of the present disclosure.

FIG. 4 is a graph 400 illustrating a variation in the reflectivity due to the black border (BB) in the presence of the protection layer 104 including Cr on the LTEM substrate 102, according to disclosed embodiments. As illustrated, the reflectivity is less than about 0.2% when the thickness of the protection layer including Cr is about 5.5 nm to about 9 nm, and when the thickness of the protection layer including Cr is about 14 nm to about 16 nm. Thus, the thickness of the protection layer including Cr can be varied as required to achieve the low reflectivity. From FIGS. 3 and 4, it is understood that the reduced reflectivity of the protection layer 104 minimizes the EUV light reflection from the image border. Additionally, the protection layer 104 minimizes damage to the LTEM during the process flow.

FIGS. 5A-5F illustrate a sequence of processing steps for manufacturing a photomask 200, according to disclosed embodiments. It is understood that additional operations can be provided before, during, and after processes shown by FIGS. 5A-5F, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously. The photomask 200 may be substantially similar to the photomask 100 in FIGS. 1 and 2A-2F and the manufacturing process may be understood with reference thereto where like numerals designate like components and are not described again in detail.

Figure 5A:
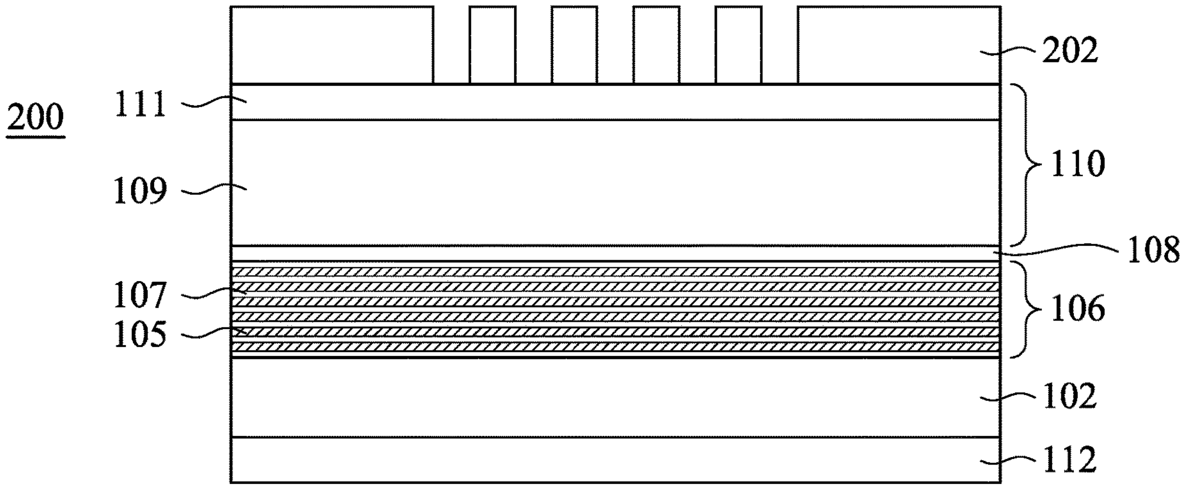
FIGS. 5A, 5B, 5C, 5D, 5E, 5F, and 5G show cross sectional views of the different processing steps for manufacturing a photomask according to some embodiments of the present disclosure.
Figure 5B:
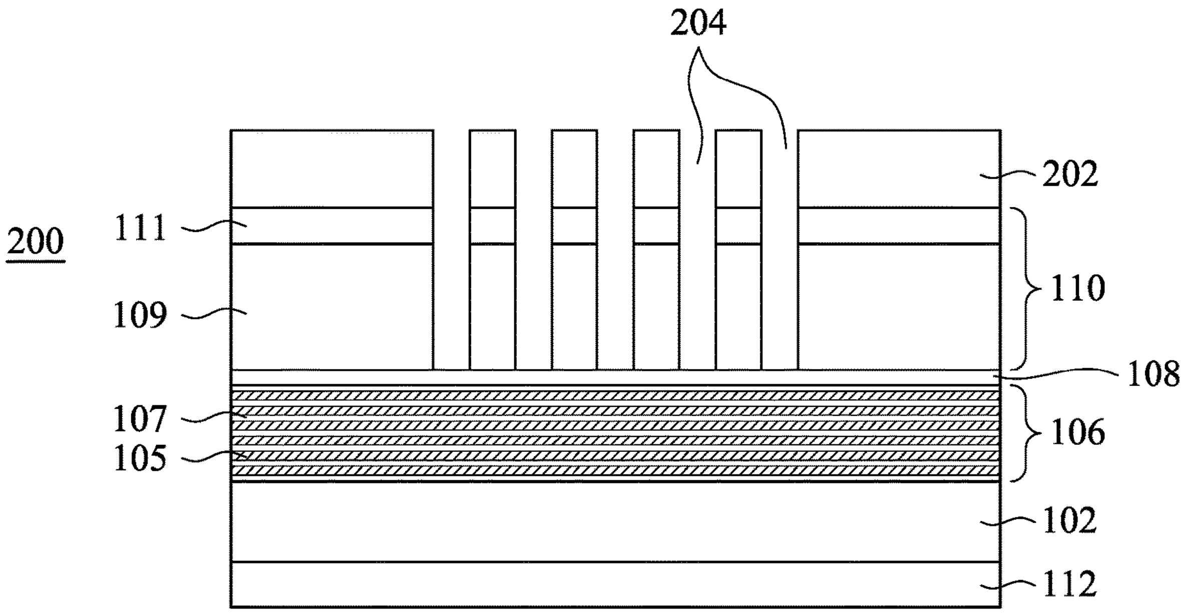
Figure 5C:
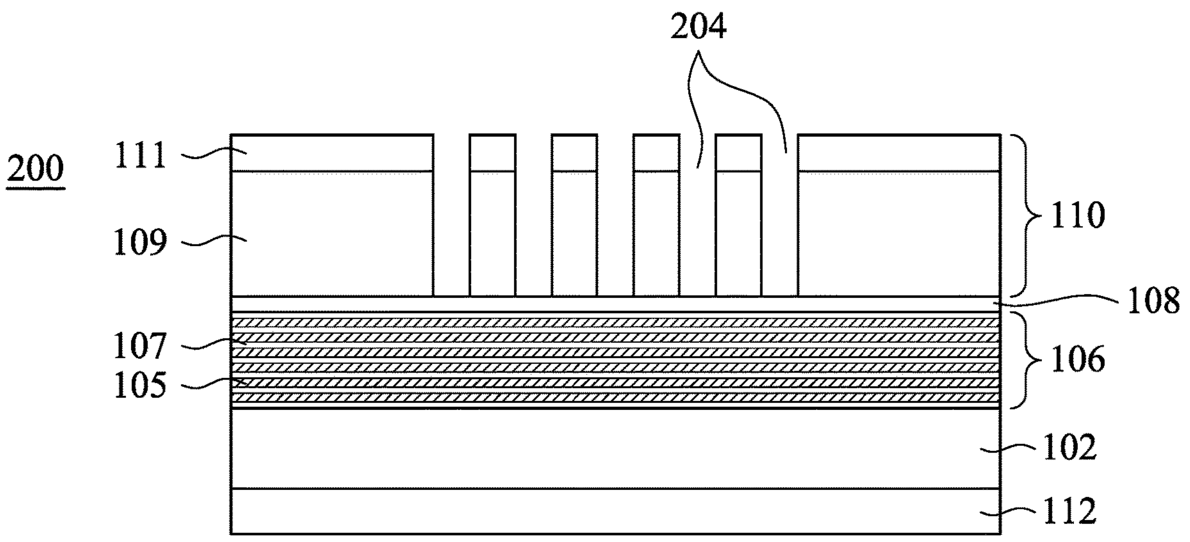
Figure 5D:
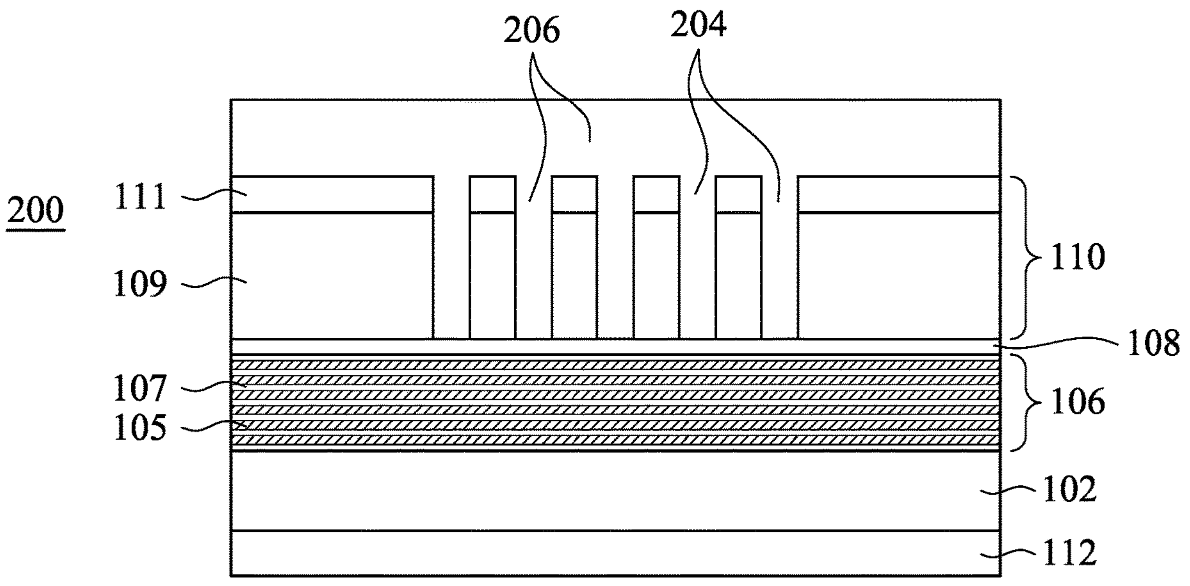
Figure 5E:
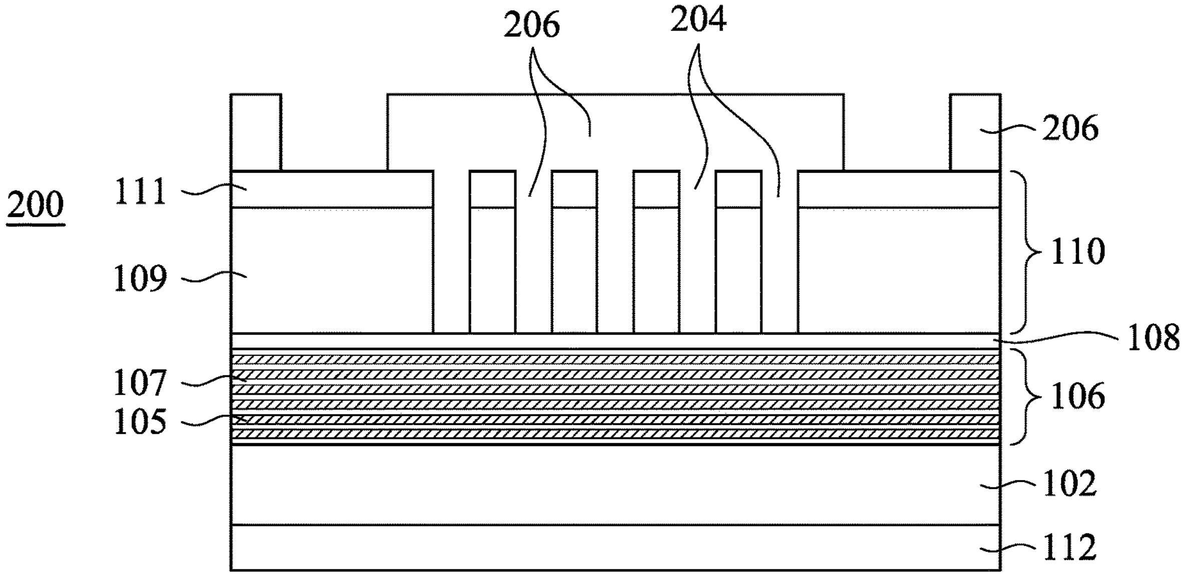

As seen in FIGS. 5A-5F, the protection layer 104 is absent in the photomask 200. In FIG. 5A, a photoresist layer 202 is deposited on the absorption layer 110 and patterned using desired patterning techniques including, for example, electron-beam lithography, photolithography, and the like. As illustrated in FIG. 5B, an etching operation is performed to remove portions of the absorption layer 110 including the bilayer of TaBO and TaBN exposed by the patterned photoresist layer 202, and thereby forming first openings 204 in the absorption layer 110 that expose portions of the capping layer 108. The remaining photoresist layer 202 is removed using a suitable stripping or plasma ashing operation, as in FIG. 5C. As illustrated in FIG. 5D, another photoresist layer 206 is deposited on the absorption layer 110 filling the first openings 204. The photoresist layer 206 is patterned to expose portions of the absorption layer 110 remaining after the previous etching operation, as illustrated in FIG. 5E.

In some embodiments, the lithography operations of the first photoresist layer and second photoresist layer include coating a photosensitive resist film over a substrate, exposing the resist film deposited over the substrate by an optical lithography tool or an electron beam writer, and developing the exposed resist film to form a resist pattern. The resist film may include a single layer resist film or a multiple layer resist films. An antireflective coating, such as a bottom antireflective coating (BARC) or a top antireflective coating (TARC) is applied below or above the resist layers in some embodiments.

Exposing the resist film deposited over the substrate includes using an optical exposing tool, such as an ArF or KrF laser, or a charged particle exposing tool, such as an e-beam. The optical exposing tool includes using a mask in some embodiments, which is a binary mask or a phase shift mask. Developing the exposed resist film includes a post exposure bake (PEB), a post development bake (PDB) process, or a combination thereof in some embodiments.

Figure 5F:
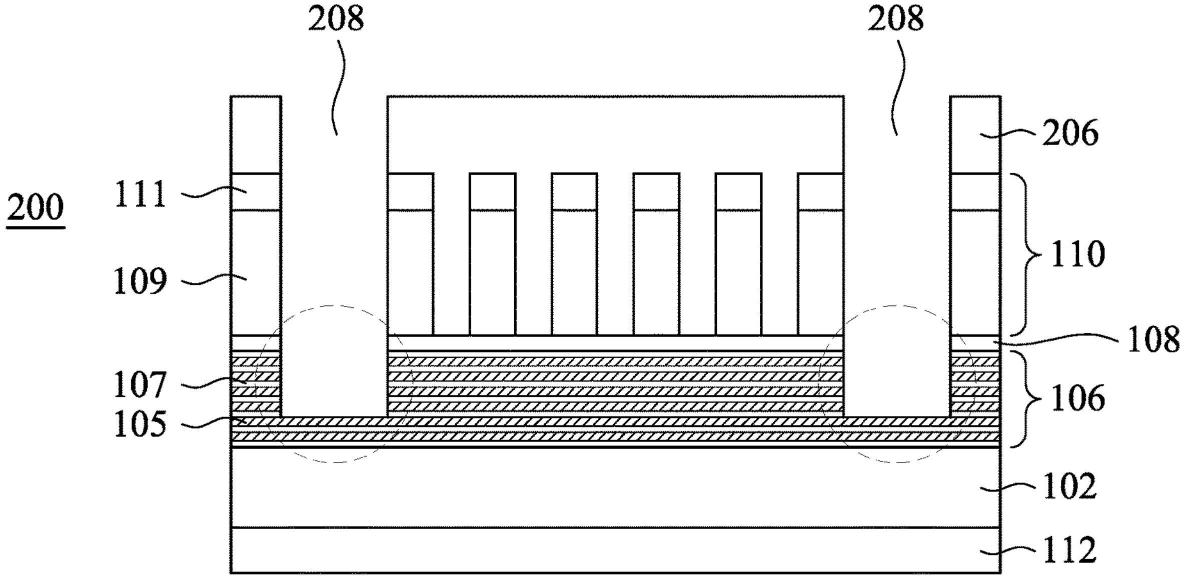

As illustrated in FIG. 5F, an etching operation is performed to remove portions of the absorption layer 110 not covered by the photoresist layer 206. In addition, the etching operation also removes portions of the capping layer 108 and the plurality of multilayer of reflecting films 106 not covered by the second photoresist layer. However, some (e.g., one or two) of the bottom-most layers of the plurality of the multilayer of reflecting films 106 are retained and thereby exposed in the openings 208 formed as a result of the etching operation. The multilayer of reflecting films 106 improve the EUV reflectivity of the photomask. The bottom-most layers of the plurality of the multilayer of reflecting films 106 are about 7 nm to about 14 nm in thickness. Referring to FIGS. 5A-5G and 2A-2G, the protection layer 104 is absent in the photomask 200 while the photomask 100 includes the protection layer 104. The protection layer 104 reduces the generation of SiO particles during EUV irradiation. In the absence of the protection layer 104 in the photomask 200, the retained layers of the plurality of the multilayer of reflecting films 106 also reduce the generation of SiO particles.

Figure 5G:
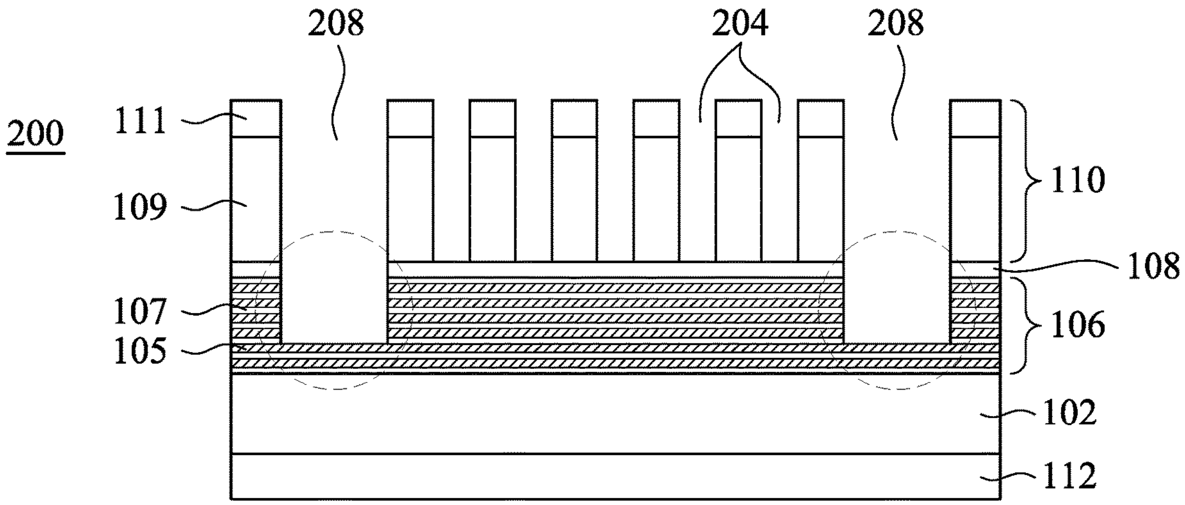

In some embodiments, the etching operation is performed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In other embodiments, the etching operation is performed using a wet etchant such as, but not limited to, HF:$HNO_3$ solution, HF:$CH_3COOH$:$HNO_3$, or $H_2SO_4$ solution and HF:$H_2O_2$:$CH_3COOH$. In some embodiments, a dry etching operation is used. The dry etching operation may use an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments, a combination of dry etching techniques and wet etching techniques are used to perform the etching operations. As illustrated in FIG. 5G, the photoresist layer 206 is subsequently removed by a suitable stripping or plasma ashing operation.

Figure 6:
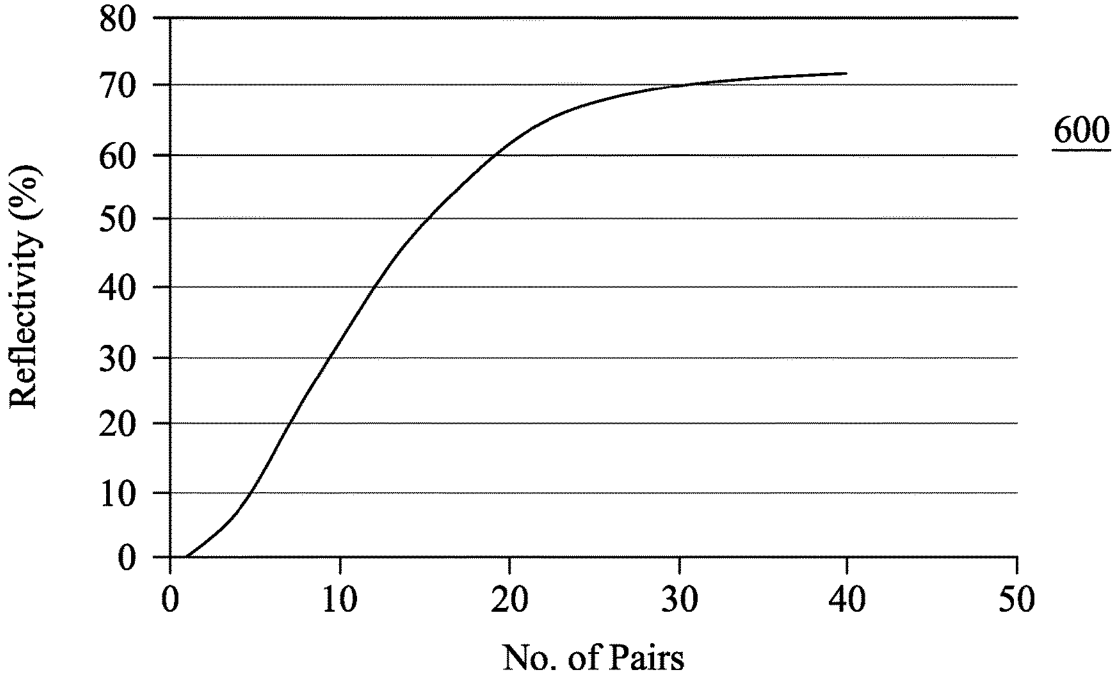
FIG. 6 is a graph illustrating a variation in the reflectivity due to black border (BB) and the presence of the bottom-most layers of the plurality of the multilayer of reflecting films according to some embodiments of the present disclosure.

FIG. 6 is a graph 600 illustrating a variation in the reflectivity due to the black border (BB) and the presence of the bottom-most layers of the plurality of the multilayer of reflecting films 106 in the photomask 200, according to disclosed embodiments. As illustrated, the reflectivity increases from less than about 0.05 to about 0.4 and 1.8% in the presence of 1 or 2 pairs of the multilayer of reflecting films 106, respectively. The reflectivity is greater than about 70% when about 30 or more pairs of the reflecting films 106 remain in the black border. The retained layers of the plurality of the multilayer of reflecting films 106 maintain a relatively high reflectivity (compared to the reflectivity in the absence of the reflecting films), while enabling use of optical proximity control (OPC) calculation to control critical dimension (CD) in the edge of main pattern to avoid the CD error from the reflectivity from black border.

FIGS. 7A-7G illustrate a sequence of processing steps for manufacturing a photomask 300, according to disclosed embodiments. It is understood that additional operations can be provided before, during, and after processes shown by FIGS. 7A-7G, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously. The photomask 300 may be substantially similar to the photomasks 100 and 200 in FIGS. 1, 2A-2F, and 5A-5F, and the manufacturing process may be understood with reference thereto where like numerals designate like components not described again in detail.

Figure 7A:
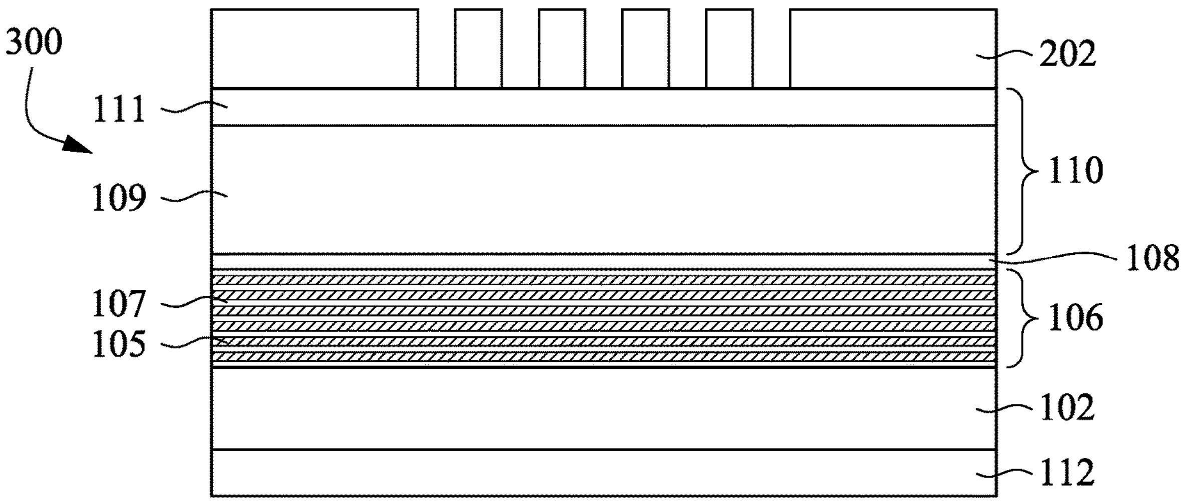
FIGS. 7A, 7B, 7C, 7D, 7E, 7F, 7G, and 7H show cross sectional views of the different processing steps for manufacturing a photomask according to some embodiments of the present disclosure.
Figure 7B:
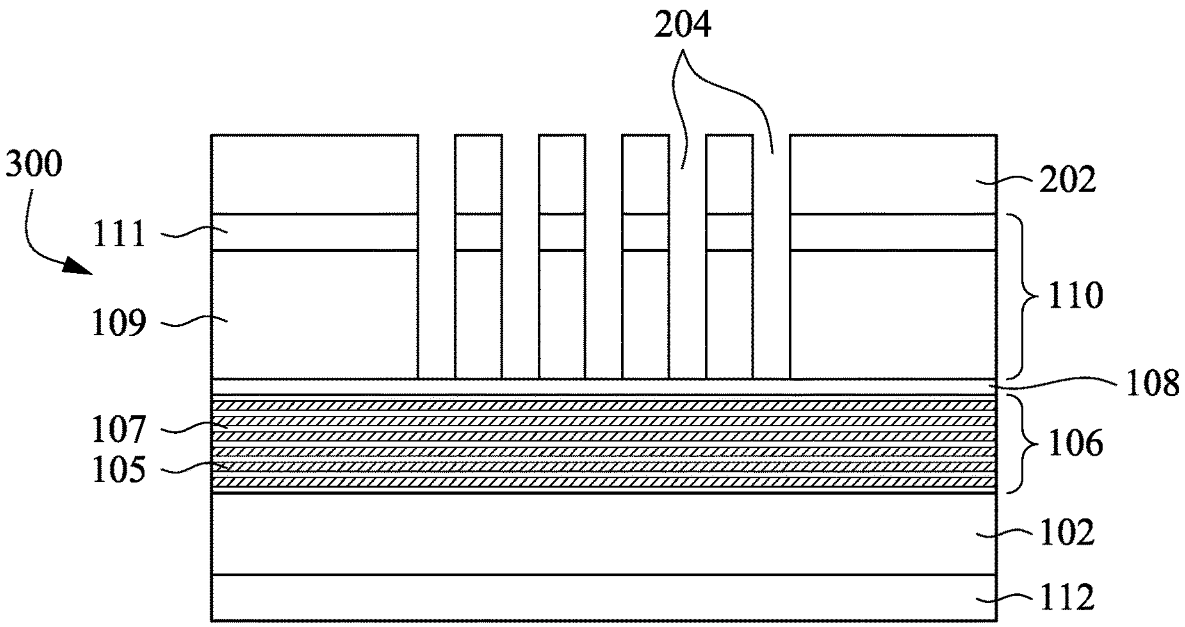

As seen in FIGS. 7A-7G, the protection layer 104 is absent in the photomask 300, similar to photomask 200 (See FIG. 5A). In FIG. 7A, a photoresist layer 202 is deposited on the absorption layer 110 and patterned using desired patterning techniques including, for example, electron-beam lithography, photolithography, and the like. As illustrated in FIG. 7B, an etching operation is performed to remove portions of the absorption layer 110 including the bilayer of TaBO and TaBN exposed by the patterned photoresist layer 202, and thereby forming first openings 204 in the absorption layer 110 that expose portions of the capping layer 108. In some embodiments, the etching operation is performed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In other embodiments, the etching operation is performed using a wet etchant such as, but not limited to, HF:$HNO_3$ solution, HF:$CH_3COOH$:$HNO_3$, or $H_2SO_4$ solution and HF:$H_2O_2$:$CH_3COOH$. In some embodiments, a dry etching operation is used. The dry etching operation may use an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments, a combination of dry etching techniques and wet etching techniques are used to perform the etching operations.

Figure 7C:
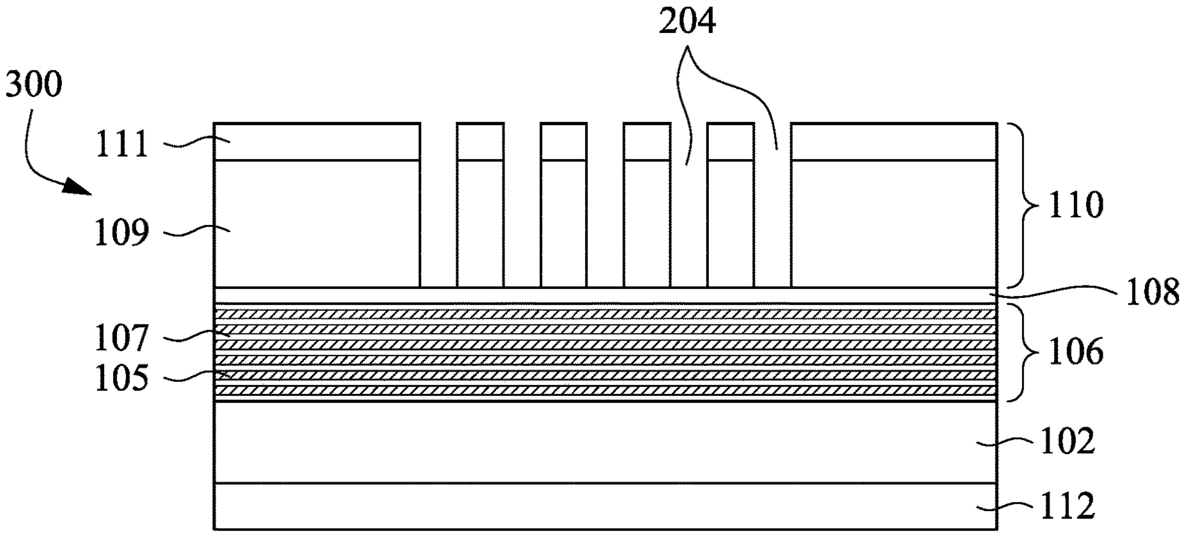
Figure 7D:
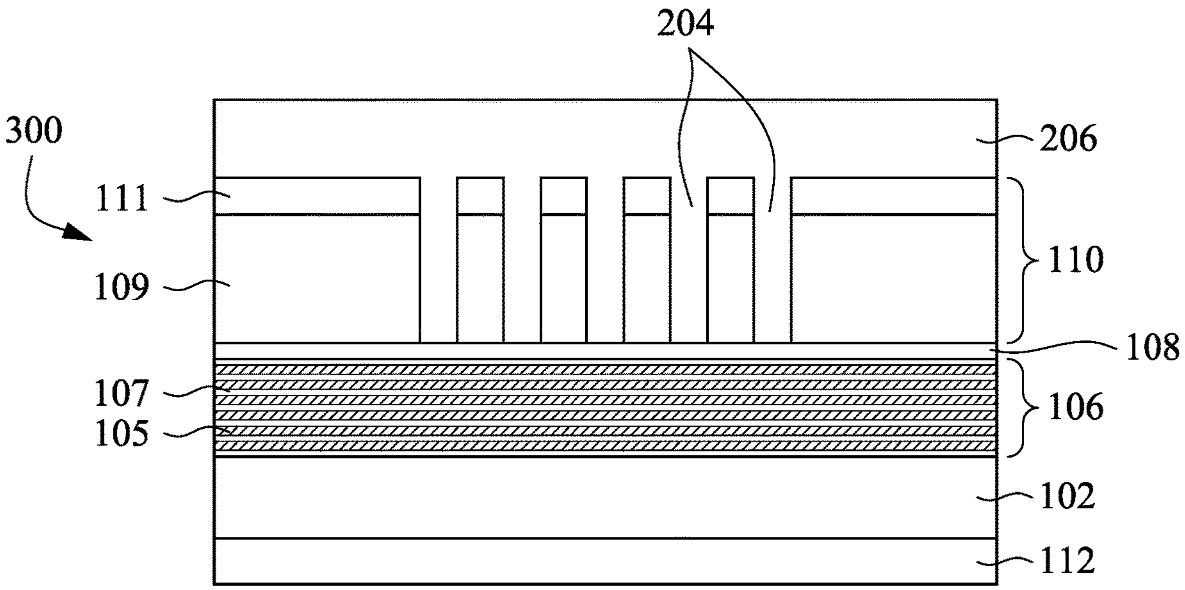
Figure 7E:
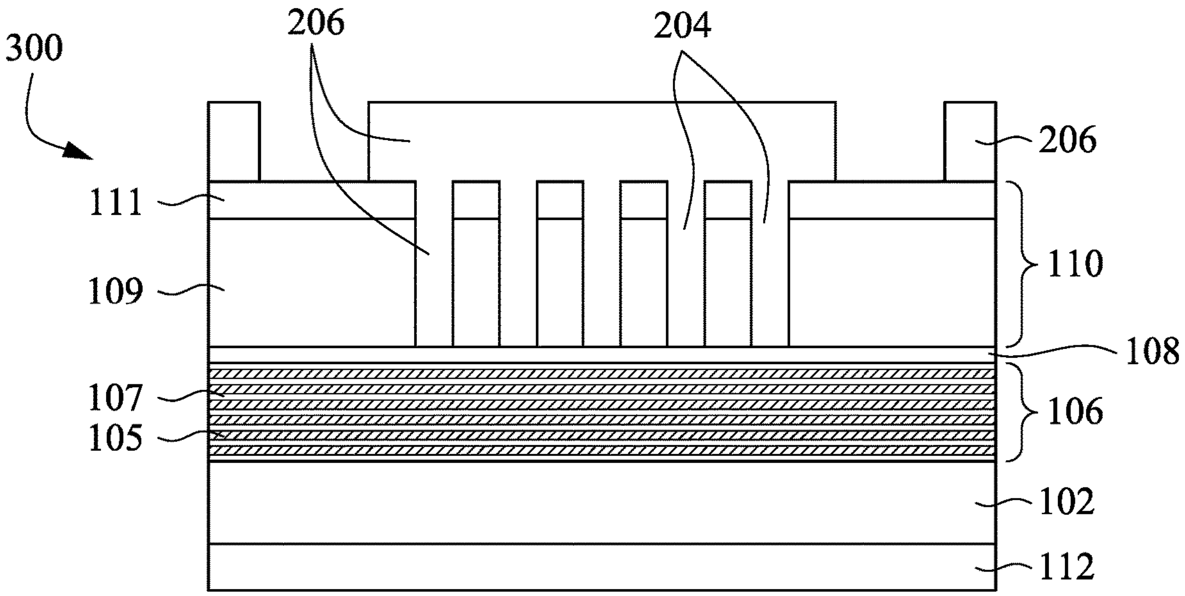

The remaining photoresist layer 202 is removed using a suitable stripping or plasma ashing operation, as in FIG. 7C. As illustrated in FIG. 7D, another photoresist layer 206 is subsequently deposited on the absorption layer 110 filling the first openings 204. The photoresist layer 206 is patterned to expose portions of the absorption layer 110 remaining after the previous etching operation, as illustrated in FIG. 7E.

In some embodiments, the lithography operations of the first photoresist layer and second photoresist layer include coating a photosensitive resist film over a substrate, exposing the resist film deposited over the substrate by an optical lithography tool or an electron beam writer, and developing the exposed resist film to form a resist pattern. The resist film may include a single layer resist film or a multiple layer resist films. An antireflective coating, such as a bottom antireflective coating (BARC) or a top antireflective coating (TARC) is applied below or above the resist layers in some embodiments.

Exposing the resist film deposited over the substrate includes using an optical exposing tool, such as an ArF or KrF laser, or a charged particle exposing tool, such as an e-beam. The optical exposing tool includes using a mask in some embodiments, which is a binary mask or a phase shift mask. Developing the exposed resist film includes a post exposure bake (PEB), a post development bake (PDB) process, or a combination thereof in some embodiments.

Figure 7F:
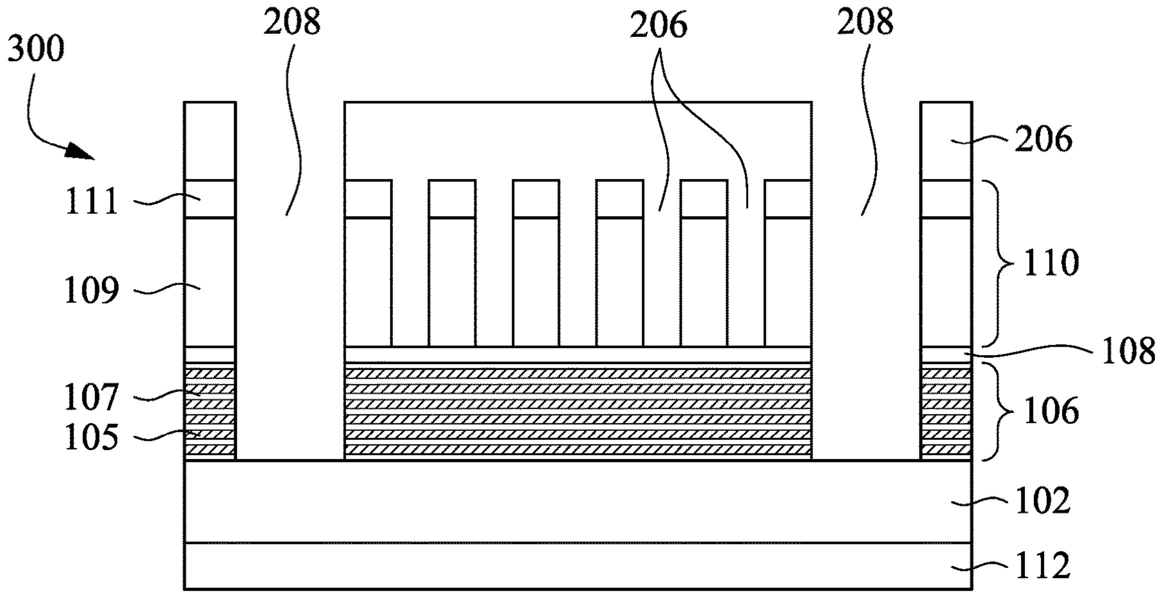

As illustrated in FIG. 7F, an etching operation is performed to remove portions of the absorption layer 110 not covered by the photoresist layer 206. In addition, the etching operation also removes portions of the capping layer 108 and the plurality of multilayers of reflecting films 106 not covered by the photoresist layer 206. As a result, the second openings 208 are formed and portions of the LTEM substrate 102 are exposed through the second openings 208.

Figure 7G:
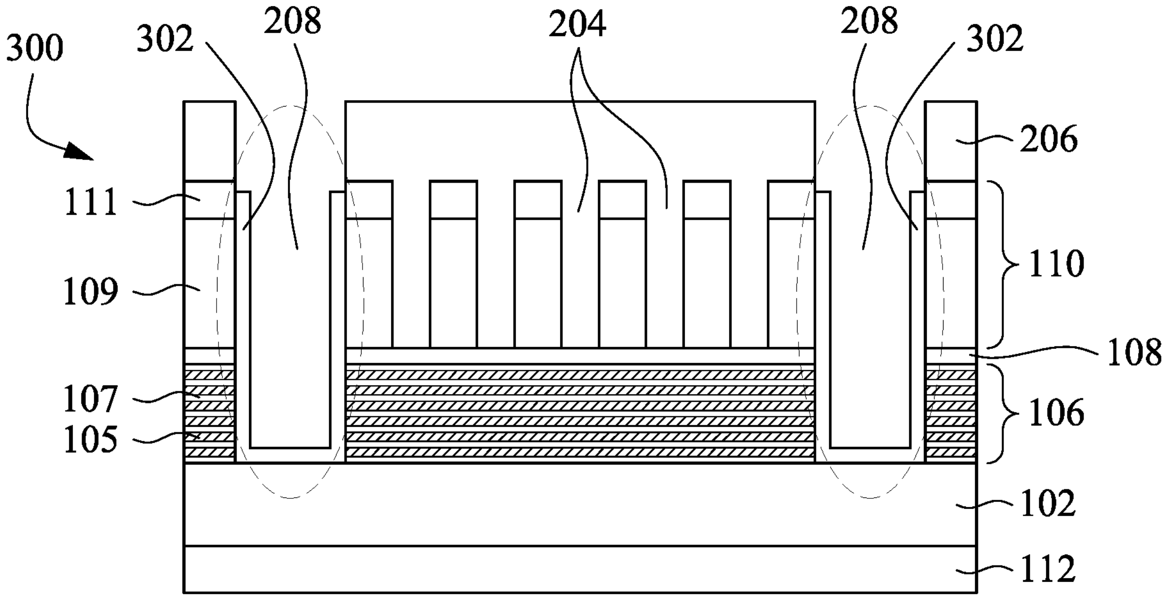

As illustrated in FIG. 7G, a protection layer 302 is deposited on the exposed LTEM substrate 102 in openings 208, and on the sidewalls of the openings 208 formed by the absorption layer 110, capping layer 108, and the plurality of multilayer of reflecting films 106. The protection layer 302 may be deposited using chemical vapor deposition (CVD) techniques including, for example, one or more of atmospheric pressure CVD (APCVD), low pressure CVD (LPCVD), laser-enhanced CVD (LECVD), and plasma-enhanced CVD (PECVD). Additionally or alternatively, the protection layer 302 may be deposited using physical vapor deposition (PVD) techniques including, for example, one or more of electrically heated evaporation sources (thermal evaporation), pulsed laser deposition, electron-beam evaporation, molecular beam epitaxy, ion beam assisted evaporation, and discharge based deposition methods (sputtering, arc evaporation). The protection layer 302 is formed after the EUV masking making; however, the protection layer 104 is deposited during EUV blank preparation.

The protection layer 302 is also formed on the top surface photoresist 206 and the sidewalls of the opening 208 formed by the in the photoresist layer 206 and can be removed using suitable etching operations. In various examples, the protection layer 302 includes a layer of Ru, RuN, RuB, TaBO, $Si_3N_4$, CrON, CrN, $Al_2O_3$, TaN, TaON, $B_4C$, SiC, TiN, $TiO_2$, SiN, and a combination thereof. In some embodiments, a thickness of the protection layer 302 is about 1 nm to about 50 nm.

Figure 7H:
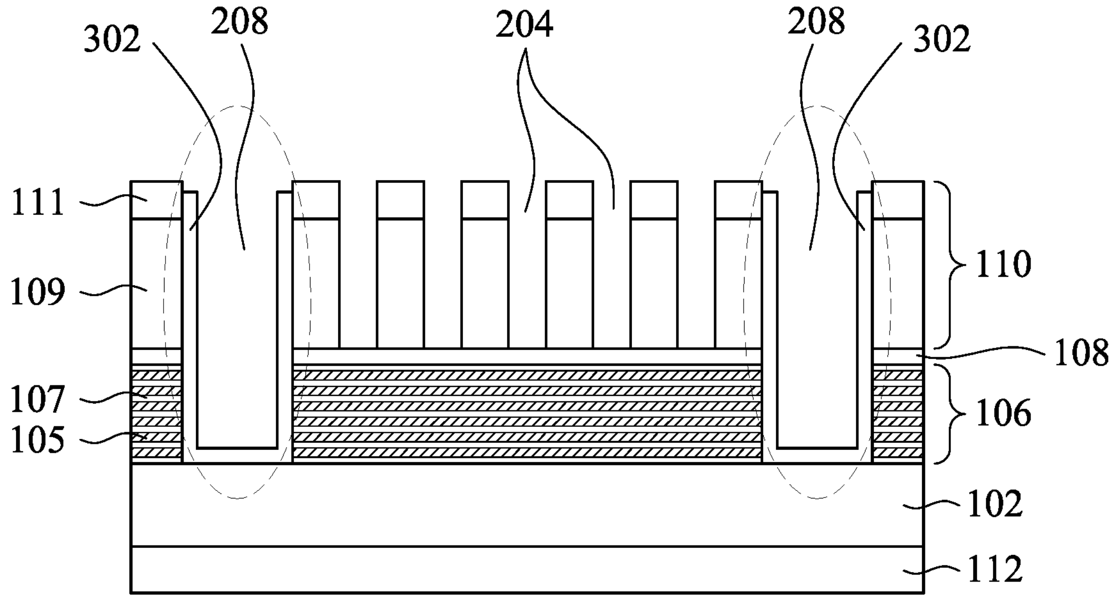

As illustrated in FIG. 7H, the photoresist layer 206 is subsequently removed by a suitable stripping or plasma ashing operation.

Figure 8:
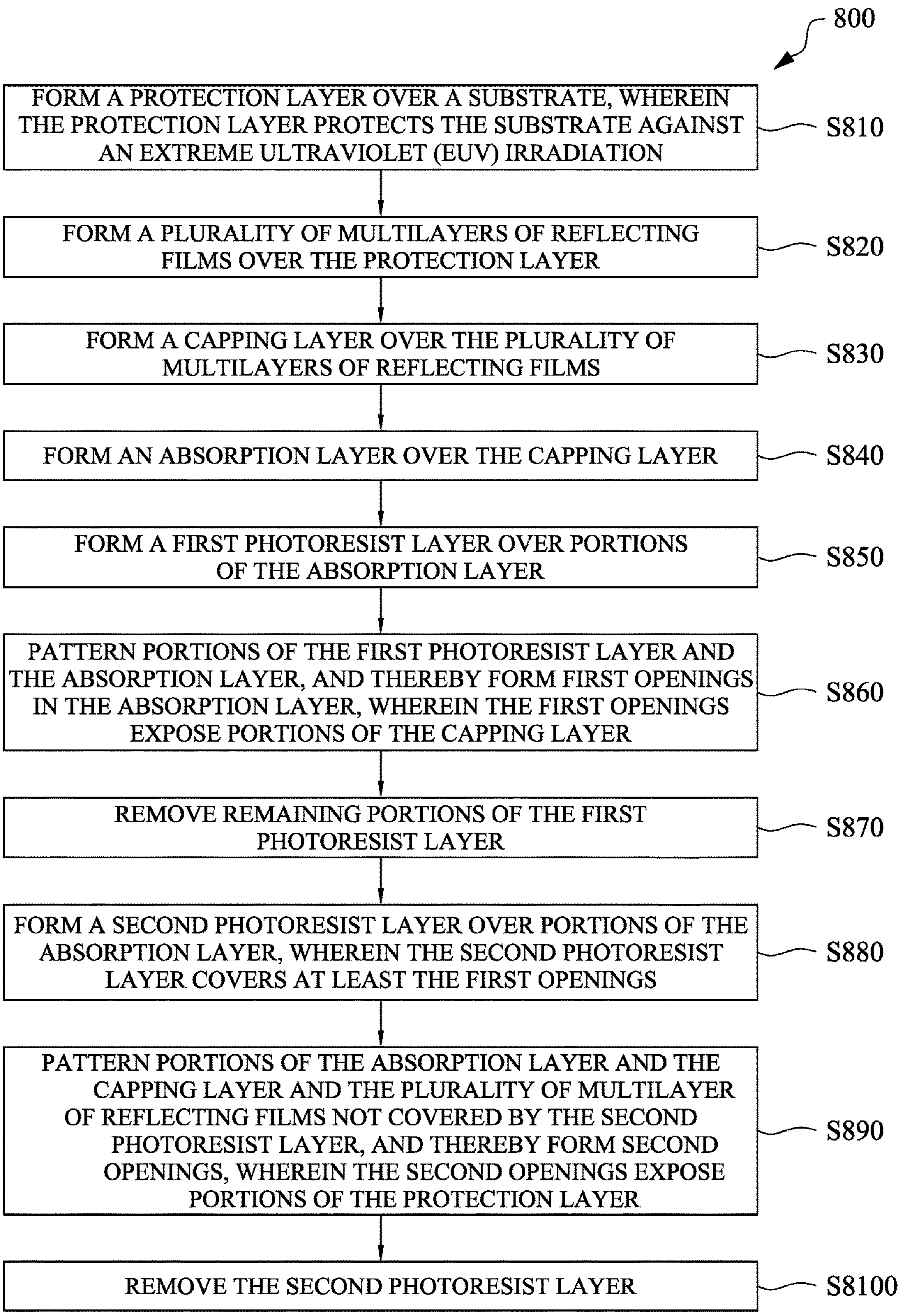
FIG. 8 is a flowchart illustrating a method of manufacturing a photomask according to an embodiment of the present disclosure.

An embodiment of the present disclosure is a method 800 of manufacturing a photomask according to the flowchart illustrated in FIG. 8. It is understood that additional operations can be provided before, during, and after processes discussed in FIG. 8, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S810 of forming a protection layer over a substrate. In some embodiments, the substrate is made of a low thermal expansion material (LTEM). The protection layer protects the substrate against extreme ultraviolet (EUV) irradiation. For example, as illustrated in FIG. 2A, protection layer 104 is formed over the substrate 102. In operation S820, a plurality of multilayers of reflecting films, such as a plurality of alternating molybdenum and silicon films, are formed over the protection layer. For example, as illustrated in FIG. 2A, multiple layers (ML) 106 of reflecting films including molybdenum 105 and silicon 107 are formed over protection layer 104. In operation S830, a capping layer, such as a ruthenium layer, is subsequently formed over the plurality of multilayers of reflecting films. For example, as illustrated in FIG. 2A, capping layer 108 is formed over the multiple layers (ML) 106 of reflecting films including molybdenum 105 and silicon 107. An absorption layer is formed over the capping layer, in operation S840. The absorption layer comprises a bilayer of TaBO and TaBN in some embodiments. For example, as illustrated in FIG. 2A, absorption layer 110 is formed over the capping layer 108. Then, a first photoresist layer is formed over portions of the absorption layer in operation S850. The photoresist layer is formed of a suitable photosensitive material composition, and may be a negative tone photoresist or a positive tone photoresist. Portions of the first photoresist layer and the absorption layer are patterned in operation S860. The first photoresist layer is patterned by selective exposure to actinic radiation in some embodiments, such as electromagnetic radiation including ultraviolet radiation and ultraviolet radiation, and particle beams, including electron beam and ion beam, followed by developing using a suitable developer. Then, the absorption layer is patterned to form first openings in the absorption layer by a suitable etching operation using the patterned first photoresist layer as a mask. For example, as illustrated in FIGS. 2B and 2C, photoresist layer 202 is formed over the absorption layer 110 and portions of the photoresist layer 202 and the absorption layer 110 are patterned to form openings 204. The first openings expose portions of the capping layer. In operation S870, remaining portions of the first photoresist layer are removed by a suitable photoresist stripping or plasma ashing operation. In operation S880, a second photoresist layer is formed over portions of the absorption layer. The second photoresist layer covers at least the first openings. As illustrated in FIG. 2E, the photoresist layer 202 is removed and photoresist layer 206 is deposited over absorption layer 110 and openings 204. In some embodiments, the second photoresist layer is patterned by selective exposure to actinic radiation, such as electromagnetic radiation including ultraviolet radiation and ultraviolet radiation, and particle beams, including electron beam and ion beam, followed by developing using a suitable developer. Then, in operation S890, portions of the absorption layer and the capping layer and the plurality of multilayer of reflecting films not covered by the second photoresist layer are patterned by a suitable etching operation using the patterned second photoresist layer as a mask. The patterning operation forms second openings. The second openings expose portions of the protection layer. Then, in operation S8100 the second photoresist layer is removed using a suitable photoresist stripping or plasma ashing operation in some embodiments. As illustrated in FIG. 2F, absorption layer 110 and the capping layer 108 and the multiple layers (ML) 106 of reflecting films not covered by the photoresist layer 206 are patterned. Openings 208 are formed exposing the protection layer 104.

Figure 9:
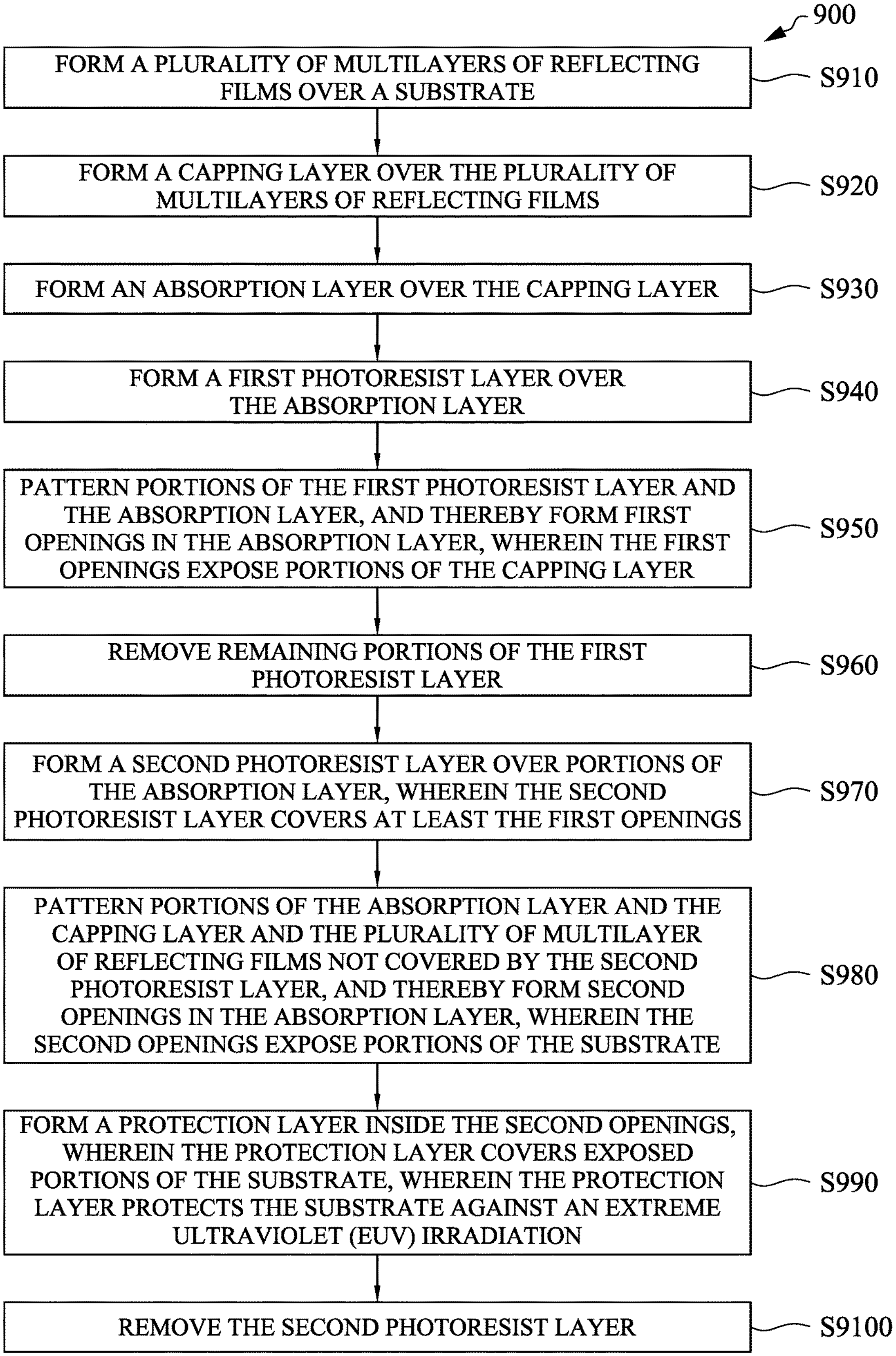
FIG. 9 is a flowchart illustrating a method of manufacturing a photomask according to an embodiment of the present disclosure.

Another embodiment of the present disclosure is a method 900 of manufacturing a semiconductor device according to the flowchart illustrated in FIG. 9. It is understood that additional operations can be provided before, during, and after processes discussed in FIG. 9, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously. The method includes an operation S910 of forming a plurality of multilayers of reflecting films over a substrate. In some embodiments, the substrate is made of a low thermal expansion material (LTEM) and the multilayers of reflecting films include alternating layers of molybdenum and silicon. In operation S920, a capping layer, such as a ruthenium layer, is formed over the plurality of multilayers of reflecting films. In operation S930, an absorption layer is formed over the capping layer. The absorption layer comprises a bilayer of TaBO and TaBN in some embodiments. Then, a first photoresist layer is formed over the absorption layer in operation S940. In operation S950, portions of the first photoresist layer and the absorption layer are patterned. The first photoresist layer is patterned by selective exposure to actinic radiation in some embodiments, such as electromagnetic radiation including ultraviolet radiation and ultraviolet radiation, and particle beams, including electron beam and ion beam, followed by developing using a suitable developer. Then, the absorption layer is patterned to form first openings in the absorption layer by a suitable etching operation using the patterned first photoresist layer as a mask. The patterning forms first openings in the absorption layer. The first openings expose portions of the capping layer. In operation S960, remaining portions of the first photoresist layer are removed using a suitable photoresist stripping or plasma ashing operation. A second photoresist layer is subsequently formed over portions of the absorption layer in operation S970. The second photoresist layer covers at least the first openings. In some embodiments, the second photoresist layer is patterned by selective exposure to actinic radiation, such as electromagnetic radiation including ultraviolet radiation and ultraviolet radiation, and particle beams, including electron beam and ion beam, followed by developing using a suitable developer. In operation S980, portions of the absorption layer and the capping layer and the plurality of multilayer of reflecting films not covered by the second photoresist layer are patterned by a suitable etching operation using the patterned second photoresist layer as a mask. The patterning forms second openings in the absorption layer. The second openings expose portions of the substrate. Then, in operation S990, a protection layer is formed inside the second openings. The protection layer covers the exposed portions of the substrate and the protection layer protects the substrate against an extreme ultraviolet (EUV) irradiation. Then, in operation S9100, the second photoresist layer is removed using a suitable photoresist stripping or plasma ashing operation in some embodiments.

As discussed above, the process of irradiating the exposed LTEM substrate 102 during EUV substrate printing can introduce particles and these particles can migrate to the pattern region including the mask pattern and cause image error. The particles may also be introduced during operations involving hydrogen plasma. Some embodiments of the present disclosure limit the particles introduced during the process of irradiating the exposed LTEM substrate by covering the LTEM substrate 102 using the protection layer 104 or the multilayer of reflecting films 106.

An embodiment of the disclosure is a method of fabricating a photomask, including forming a protection layer over a substrate, wherein the protection layer protects the substrate against an extreme ultraviolet (EUV) irradiation and serves as an etch stop layer. A plurality of multilayers of reflecting films are formed over the protection layer. A capping layer is formed over the plurality of multilayers of reflecting films. An absorption layer is formed over the capping layer. A first photoresist layer is formed over portions of the absorption layer. Portions of the first photoresist layer and the absorption layer are patterned, thereby forming first openings in the absorption layer. The first openings expose portions of the capping layer. Remaining portions of the first photoresist layer are removed and a second photoresist layer is formed over portions of the absorption layer. The second photoresist layer covers at least the first openings. Portions of the absorption layer and the capping layer and the plurality of multilayer of reflecting films not covered by the second photoresist layer are patterned, thereby forming second openings. The second openings expose portions of the protection layer. The second photoresist layer is removed. In an embodiment, the method includes forming the substrate over a blind layer, wherein the blind layer is a CrN layer. In an embodiment, the protection layer includes a layer of RuN, RuB, TaBO, $Si_3N_4$, CrON, CrN, $Al_2O_3$, TaON, $B_4C$, SiC, TiN, $TiO_2$, or SiN. In an embodiment, the layer of RuN, RuB, TaBO, $Si_3N_4$, CrON, CrN, $Al_2O_3$, TaON, $B_4C$, SiC, TiN, $TiO_2$, or SiN has a thickness of 1 nm to 30 nm. In an embodiment, the plurality of multilayers of reflecting films includes alternately stacked layers of Mo and Si. In an embodiment, the capping layer includes one or more of Ru, RuN, RuO, and RuNb. In an embodiment, the absorption layer includes a bilayer of TaBO and TaBN, a bilayer of TaBO and CrN, or a bilayer of TaBO and CrO. In an embodiment, the substrate includes a low thermal expansion material (LTEM).

Another embodiment of the disclosure is a method of fabricating a photomask, including forming a plurality of multilayers of reflecting films over a substrate. A capping layer is formed over the plurality of multilayers of reflecting films. An absorption layer is formed over the capping layer. A first photoresist layer is formed over the absorption layer. Portions of the first photoresist layer and the absorption layer are patterned, thereby forming first openings in the absorption layer. The first openings expose portions of the capping layer. Remaining portions of the first photoresist layer are removed. A second photoresist layer is formed over portions of the absorption layer, wherein the second photoresist layer covers at least the first openings. Portions of the absorption layer and the capping layer and the plurality of multilayer of reflecting films not covered by the second photoresist layer are patterned, thereby forming second openings in the absorption layer. The second openings expose portions of the substrate. A protection layer is formed inside the second openings, wherein the protection layer covers the exposed portions of the substrate and wherein the protection layer protects the substrate against an extreme ultraviolet (EUV) irradiation. The second photoresist layer is removed. In an embodiment, the method includes forming the substrate over a blind layer, wherein the blind layer is a CrN layer. In an embodiment, the protection layer includes a layer of RuN, RuB, TaBO, $Si_3N_4$, CrON, CrN, $Al_2O_3$, TaON, $B_4C$, SiC, TiN, $TiO_2$, or SiN. In an embodiment, the layer of RuN, RuB, TaBO, $Si_3N_4$, CrON, CrN, $Al_2O_3$, TaON, $B_4C$, SiC, TiN, $TiO_2$, or SiN has a thickness of 1 nm to 30 nm. In an embodiment, the plurality of multilayers of reflecting films includes alternately stacked layers of Mo and Si. In an embodiment, the capping layer includes one or more of Ru, RuN, RuO, and RuNb. In an embodiment, the absorption layer includes a bilayer of TaBO and TaBN, a bilayer of TaBO and CrN, or a bilayer of TaBO and CrO. In an embodiment, the substrate includes a low thermal expansion material (LTEM). In an embodiment, the protection layer covers sidewalls of the second openings formed by the absorption layer, the capping layer, and the plurality of multilayer of reflecting films.

An embodiment of the disclosure is a photomask including a plurality of multilayers of reflecting films disposed over a substrate. A capping layer is disposed over the plurality of multilayers of reflecting films. An absorption layer is disposed over the capping layer. The absorption layer includes first openings. The first openings expose portions of the capping layer. A protection layer is disposed inside second openings, wherein the second openings are formed in the absorption layer, the capping layer, and the plurality of multilayer of reflecting films to expose portions of the substrate. The protection layer protects the substrate against an extreme ultraviolet (EUV) irradiation. In an embodiment, a blind layer is disposed below the substrate, wherein the blind layer is a CrN layer. In an embodiment, the protection layer includes a layer of RuN, RuB, TaBO, $Si_3N_4$, CrON, CrN, $Al_2O_3$, TaON, $B_4C$, SiC, TiN, $TiO_2$, or SiN. In an embodiment, the layer of RuN, RuB, TaBO, $Si_3N_4$, CrON, CrN, $Al_2O_3$, TaON, $B_4C$, SiC, TiN, $TiO_2$, or SiN has a thickness of 1 nm to 30 nm. In an embodiment, the plurality of multilayers of reflecting films includes alternately stacked layers of Mo and Si, the capping layer includes one or more of Ru, RuN, RuO, and RuNb, the absorption layer includes a bilayer of TaBO and TaBN, a bilayer of TaBO and CrN, or a bilayer of TaBO and CrO, and the substrate includes a low thermal expansion material (LTEM). In an embodiment, the protection layer covers sidewalls of the second openings formed by the absorption layer, the capping layer, and the plurality of multilayer of reflecting films.

Another embodiment of the disclosure is a method of fabricating a photomask, including forming a plurality of multilayers of reflecting films over a substrate. A capping layer is formed over the plurality of multilayers of reflecting films. An absorption layer is formed over the capping layer. A first photoresist layer is formed over portions of the absorption layer. Portions of the first photoresist layer and the absorption layer are patterned, thereby forming first openings in the absorption layer. The first openings expose portions of the capping layer. Remaining portions of the first photoresist layer are removed. A second photoresist layer is formed over portions of the absorption layer, wherein the second photoresist layer covers at least the first openings. Portions of the absorption layer and the capping layer and at least one of the plurality of multilayer of reflecting films not covered by the second photoresist layer are patterned, thereby forming second openings in the absorption layer and the capping layer. The second openings expose portions of one or two bottom-most layers of the plurality of the multilayer of reflecting films. The second photoresist layer is removed. In an embodiment, the method includes forming the substrate over a blind layer, wherein the blind layer is a CrN layer. In an embodiment, the plurality of multilayers of reflecting films includes alternately stacked layers of Mo and Si. In an embodiment, the capping layer includes one or more of Ru, RuN, RuO, and RuNb, and the absorption layer comprises a bilayer of TaBO and TaBN, a bilayer of TaBO and CrN, or a bilayer of TaBO and CrO. In an embodiment, the substrate comprises a low thermal expansion material (LTEM).

Still another embodiment of the disclosure is a method of fabricating a photomask, including forming a plurality of multilayers of reflecting films over a substrate. A capping layer is formed over the plurality of multilayers of reflecting films. An absorption layer is formed over the capping layer. A first photoresist layer is formed over the absorption layer. Portions of the first photoresist layer and the absorption layer are patterned, thereby forming first openings in the absorption layer. The first openings expose portions of the capping layer. Remaining portions of the first photoresist layer are removed. A second photoresist layer is formed over portions of the absorption layer, wherein the second photoresist layer covers at least the first openings. Portions of the absorption layer and the capping layer and the plurality of multilayer of reflecting films not covered by the second photoresist layer are patterned, thereby forming second openings in the absorption layer. The second openings expose portions of the substrate. A protection layer is formed inside the second openings, wherein the protection layer covers the exposed portions of the substrate and sidewalls of the second openings formed by the absorption layer, the capping layer, and the plurality of multilayer of reflecting films. The protection layer protects the substrate against an extreme ultraviolet (EUV) irradiation. The second photoresist layer is removed. In an embodiment, the method includes forming the substrate over a blind layer, wherein the blind layer is a CrN layer. In an embodiment, the protection layer includes a layer of RuN, RuB, TaBO, $Si_3N_4$, CrON, CrN, $Al_2O_3$, TaON, $B_4C$, SiC, TiN, $TiO_2$, or SiN with a thickness of 1 nm to 30 nm. In an embodiment, the plurality of multilayers of reflecting films includes alternately stacked layers of Mo and Si. In an embodiment, the capping layer includes one or more of Ru, RuN, RuO, and RuNb. In an embodiment, the absorption layer includes a bilayer of TaBO and TaBN a bilayer of TaBO and CrN, or a bilayer of TaBO and CrO. In an embodiment, the substrate comprises a low thermal expansion material (LTEM).

Another embodiment of the disclosure is a photomask including a plurality of multilayers of reflecting films disposed over a substrate. A capping layer is disposed over the plurality of multilayers of reflecting films. An absorption layer is disposed over the capping layer. A first portion of the photomask includes first openings in the absorption layer. The first openings expose portions of the capping layer. A second portion of the photomask includes second openings in the absorption layer and the capping layer. The second openings expose portions of one or two bottom-most layers of the plurality of the multilayer of reflecting films. In an embodiment, the photomask includes a blind layer disposed below the substrate, wherein the blind layer is a CrN layer. In an embodiment, the plurality of multilayers of reflecting films comprises alternately stacked layers of Mo and Si. In an embodiment, the capping layer includes one or more of Ru, RuN, RuO, and RuNb. In an embodiment, the absorption layer includes a bilayer of TaBO and TaBN, a bilayer of TaBO and CrN, or a bilayer of TaBO and CrO. In an embodiment, the substrate includes a low thermal expansion material (LTEM).

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photomask comprising:
a plurality of multilayers of reflecting films disposed over a substrate;
a capping layer disposed over the plurality of multilayers of reflecting films;
an absorption layer disposed over the capping layer;
first openings in the absorption layer, the first openings exposing portions of the capping layer;
second openings defining a black border region of the photomask, the second openings extending through the absorption layer, the capping layer and the plurality of multilayers of reflecting films to the substrate; and
a protection layer disposed inside the second openings on the substrate,
wherein the protection layer comprises a layer of RuB, TaBO, CrON, CrN, TaON, $B_4C$, or TiN, and the protection layer on sidewalls of the second openings has a vertical extent that is less than a combined vertical extent of the plurality of multilayers of reflective films, the capping layer, and the absorption layer.

2. The photomask of claim 1, further comprising:
a blind layer disposed below the substrate, wherein the blind layer is a CrN layer.

3. The photomask of claim 1, wherein the layer of RuB, TaBO, CrON, CrN, TaON, $B_4C$, or TiN has a thickness of 1 nm to 30 nm.

4. The photomask of claim 3, wherein the protection layer on the sidewalls of the second openings comprises at least one of:
RuB having a thickness ranging from 6.5 nm to 8.5 nm, or 14.5 nm to 16.5 nm;
TaBO or TaON having a thickness ranging from 2 nm to 14 nm; or
CrON or CrN having a thickness ranging from 5.5 nm to 16 nm.

5. The photomask of claim 1, wherein:
the plurality of multilayers of reflecting films comprises alternately stacked layers of Mo and Si,
the capping layer includes one or more of Ru, RuN, RuO, and RuNb,
the absorption layer comprises a bilayer of TaBO and TaBN, a bilayer of TaBO and CrN, or a bilayer of TaBO and CrO, and
the substrate comprises a low thermal expansion material.

6. The photomask of claim 1, wherein the protection layer comprises a layer of CrON, $B_4C$, or TiN.

7. The photomask of claim 1, wherein the protection layer protects the substrate against extreme ultraviolet (EUV) irradiation.

8. A photomask comprising:
a plurality of multilayers of reflecting films disposed over a substrate;
a capping layer disposed over the plurality of multilayers of reflecting films;
an absorption layer disposed over the capping layer;
first openings in the absorption layer, the first openings exposing portions of the capping layer; and
at least one layer of film of the plurality of multilayers of reflecting films is disposed inside second openings of a black border region of the photomask, wherein the second openings are formed in the absorption layer, the capping layer, and the plurality of multilayer of reflecting films,
wherein the at least one layer of film of the plurality of multilayers of reflecting films in the black border region includes one or more bottom-most layers of the plurality of the multilayer of reflecting films, and a vertical extent of the at least one layer of film on sidewalls of the second openings is less than a combined vertical extent of the plurality of multilayers of reflecting films, the capping layer, and the absorption layer,
the at least one layer of film of the plurality of multilayers of reflecting films in the black border region has a thickness of 7 nm to 14 nm, and a reflectivity ranging from 0.05% to 0.4%.

9. The photomask of claim 8, further comprising:
a blind layer disposed below the substrate, wherein the blind layer is a CrN layer.

10. The photomask of claim 8, wherein the plurality of multilayers of reflecting films include alternately stacked layers of Mo and Si.

11. The photomask of claim 8, wherein the capping layer includes one or more of Ru, RuN, RuO, and RuNb.

12. The photomask of claim 8, wherein the absorption layer includes a bilayer of TaBO and TaBN, a bilayer of TaBO and CrN, or a bilayer of TaBO and CrO.

13. The photomask of claim 8, wherein the substrate comprises a low thermal expansion material.

14. A photomask comprising:
a plurality of multilayers of reflecting films disposed over a substrate;
a capping layer disposed over the plurality of multilayers of reflecting films;
an absorption layer disposed over the capping layer;
first openings in the absorption layer, the first openings exposing portions of the capping layer;
second openings defining a black border region of the photomask, the second openings extending through the absorption layer, the capping layer and the plurality of multilayers of reflecting films, exposing the substrate; and
a protection layer disposed inside the second openings and in direct contact with the substrate exposed in the second openings and sidewalls of the second openings formed by the absorption layer, the capping layer, and the plurality of multilayers of reflecting films, and
the protection layer comprises a layer of RuB, TaBO, CrON, CrN, TaON, $B_4C$, or TiN, wherein the protection layer is configured to act as an etch stop layer during a photomask cleaning operation, and a vertical extent of the protection layer on the sidewalls of the second openings is less than a combined vertical extent of the plurality of multilayers of reflecting films, the capping layer, and the absorption layer.

15. The photomask of claim 14, further comprising:

a blind layer disposed below the substrate, wherein the blind layer is a CrN layer.

16. The photomask of claim 14, wherein the layer of RuB, TaBO, CrON, CrN, TaON, $B_4C$, or TiN has a thickness of 1 nm to 30 nm.

17. The photomask of claim 14, wherein the plurality of multilayers of reflecting films includes alternately stacked layers of Mo and Si.

18. The photomask of claim 14 wherein the absorption layer includes a bilayer of TaBO and TABN, a bilayer of TaBO and CrN, or a bilayer of TaBO and CrO.

19. The photomask of claim 14, wherein the protection layer comprises a layer of RuB, TaBO, CrON, CrN, or TaON.

20. The photomask of claim 14, wherein the protection layer protects the substrate against an extreme ultraviolet (EUV) irradiation.

* * * * *